(12) United States Patent
Motoyoshi

(10) Patent No.: US 6,982,446 B2
(45) Date of Patent: Jan. 3, 2006

(54) NONVOLATILE MAGNETIC MEMORY DEVICE AND MANUFACTURING METHOD THEREOF

(75) Inventor: Makoto Motoyoshi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/750,263

(22) Filed: Dec. 31, 2003

(65) Prior Publication Data

US 2004/0157427 A1 Aug. 12, 2004

(30) Foreign Application Priority Data

Jan. 6, 2003 (JP) .......................... P2003-000486

(51) Int. Cl.
*H01L 29/76* (2006.01)

(52) U.S. Cl. .......................... 257/295; 438/3; 257/421; 257/200

(58) Field of Classification Search ................ 438/622
See application file for complete search history.

(56) References Cited

U.S. PATENT DOCUMENTS

| 6,473,336 B1 * | 10/2002 | Nakajima et al. ........... 365/171 |
| 6,587,370 B2 * | 7/2003 | Hirai ......................... 365/171 |
| 6,849,888 B2 * | 2/2005 | Ooishi ........................ 257/295 |

* cited by examiner

*Primary Examiner*—Thao P. Le
(74) *Attorney, Agent, or Firm*—Sonnenschein, Nath & Rosenthal LLP

(57) ABSTRACT

An TMR-type MRAM comprising a transistor for selection; a first connecting hole; a first wiring (write-in word line); a second insulating interlayer covering a first insulating interlayer and the first wiring; a TRM device formed on the second insulating interlayer; a second wiring (bit line) formed on a third insulating interlayer; and a second connecting hole formed through the second insulating interlayer and connected to the first connecting hole, in which an end face of an extending portion of the other end of the TRM device is in contact with the second connecting hole.

1 Claim, 40 Drawing Sheets

[STEP-120]

[STEP-125]

[STEP-130]

[STEP-130] CONTINUED

[STEP-135]

[STEP-140]

[STEP-145]

[STEP-150]

[STEP-205]

[STEP-210]

[STEP-215]

[STEP-305]

[STEP-310]

[STEP-315]

[STEP-325]

[STEP-330]

[STEP-335]

[STEP-405]

[STEP-410]

[STEP-415]

[STEP-425]

[STEP-430]

[STEP-435]

[STEP-510]

[STEP-515]

[STEP-520]

[STEP-530]

[STEP-535]

[STEP-615]

[STEP-620]

[STEP-630]

[STEP-635]

[STEP-20]

[STEP-30]

[STEP-30] CONTINUED

[STEP-40]

[STEP-50]

[STEP-60]

[STEP-60] CONTINUED

[STEP-60] CONTINUED

US 6,982,446 B2

NONVOLATILE MAGNETIC MEMORY DEVICE AND MANUFACTURING METHOD THEREOF

BACKGROUND OF THE INVENTION AND RELATED ART STATEMENT

The present invention relates to a nonvolatile magnetic memory device and a manufacturing method thereof. More specifically, the present invention relates to a nonvolatile magnetic memory device called a TMR (Tunnel Magneto resistance) type MRAM (Magnetic Random Access Memory) and a manufacturing method thereof.

With great diffusion of information communication machines, particularly, personal small machines such as personal digital assistances, various semiconductor devices such as a memory, a logic and so on, constituting such machines are being demanded to cope with higher performances such as a higher degree of integration, faster operation capability and lower power consumption. Particularly, a nonvolatile memory is considered indispensable in the ubiquitous era. Even if the depletion of a power supply or some troubles occur or a server is disconnected to a network due to some failure, important information can be stored or protected with a nonvolatile memory. Further, recently available personal digital assistances are designed such that the power consumption is reduced to a lowest level possible by maintaining non-operating circuit blocks in a standby state, and the waste of power consumption and a memory can be avoided if a nonvolatile memory capable of working as a fast-speed work memory and a mass-storage memory can be realized. Further, if a fast-speed and mass-storage nonvolatile memory can be realized, the "instant-on" function of booting in the instance of turning on power can be made possible.

The nonvolatile memory includes a flash memory using a semiconductor material and a ferroelectric nonvolatile semiconductor memory (FERAM, Ferroelectric Random Access Memory) using a ferroelectric material. However, the flash memory has a defect that the writing speed is slow since it is in the order of microseconds. On the other hand, in FERAM, the number of times of re-writability thereof is $10^{12}$ to $10^{14}$, and the number cannot be said to be sufficient for replacing SRAM or DRAM with FERAM, and there is pointed out another problem that the micro-fabrication of a ferroelectric layer is difficult.

As a nonvolatile memory free of the above defects, a nonvolatile memory device called MRAM (Magnetic Random Access Memory) is in the limelight. The MRAM at an early development stage was based on a spin valve using a GMR (Giant magnetoresistance) effect. Since, however, the memory cell resistance against a load is as low as 10 to 100 Ω, the power consumption per bit on readout is large, and the defect is that it is difficult to attain the capacity of mass storage.

While the MRAM using a TMR (Tunnel Magnetoresistance) effect had a resistance change ratio of 1–2% at room temperature at an early development stage, it has come to be possible to obtain a resistance change ratio close to 20% in recent years, so that the MRAM using the TMR effect is highlighted. The TMR-type MRAM has a simple structure and enables easy scaling, and recording is made by the rotation of a magnetic moment, so that the number of times of possible re-writing is great. Further, it is expected that the TMR-type MRAM is very rapid with regard to an access time period, and it is already said that the TMR-type MRAM is capable of an operation at 100 MHz.

FIG. 40 shows a schematic partial cross-sectional view of a conventional TMR-type MRAM (to be simply referred to as "MRAM" hereinafter). The MRAM comprises a transistor for selection TR made of a MOS-type FET and a tunnel magnetoresistance device 130.

The tunnel magnetoresistance device 130 has a stacking structure constituted of a first ferromagnetic layer, a tunnel barrier 134 and a second ferromagnetic layer. More specifically, the first ferromagnetic layer has a two-layer structure, for example, of an anti-ferromagnetic layer 132 positioned below and a pinned magnetic layer 133 (called a reference layer as well) positioned above and has an intense unidirectional magnetic anisotropy due to an exchange interaction working between these two layers. The second ferromagnetic layer of which the magnetization direction rotates relatively easily is also called a free layer or memory layer 135. The tunnel barrier 134 works to cut a magnetic coupling between the memory layer 135 and the pinned magnetic layer 133 and also to flow a tunnel current. A bit line BL for connecting the MRAMs is formed on a third insulating interlayer 128. A top coating film 136 formed between the bit line BL and the memory layer 135 works to prevent mutual diffusion of atoms constituting the bit line BL and atoms constituting the memory layer 135, to reduce a contact resistance and to prevent the oxidation of the memory layer 135. In Figure, reference numeral 131 indicates a barrier layer formed between the anti-ferromagnetic layer 132 and a second insulating interlayer 125.

Further, a write-in word line RWL is arranged below the tunnel magnetoresistance device 130 through the second insulating interlayer 125. Generally, the extending direction (first direction) of the write-in word line RWL and the extending direction (second direction) of the bit line BL cross each other at right angles.

The transistor for selection TR is formed in that portion of a semiconductor substrate 110 which portion is surrounded by a device isolation region 111, and the transistor for selection TR is covered with a first insulating interlayer 121. One source/drain region 114B is connected to the barrier layer 131, the anti-ferromagnetic layer 132 and the pinned magnetic layer 133 through a first connecting hole 123 constituted of a tungsten plug, a landing pad 124 and a second connecting hole 127. That is, the second connecting hole 127 comprises extending portions of the barrier layer 131, the anti-ferromagnetic layer 132 and the pinned magnetic layer 133. The other source/drain region 114A is connected to a sense line 116 through a contact hole 115. In Figure, reference numeral 112 indicates a gate electrode, and reference numeral 113 indicates a gate insulating film.

In an MRAM array, the MRAM is arranged in an intersecting point of the bit line BL and the write-in word line RWL.

When data is written into the above-constituted MRAM, current is flowed in the bit line BL and the write-in word line RWL, to form a synthetic magnetic field, and the direction of magnetization of the second ferromagnetic layer (memory layer 135) is changed by means of the synthetic magnetic field, whereby, "1" or "0" is recorded into the second ferromagnetic layer (memory layer 135).

Data is read out by bringing the transistor for selection TR into an ON-state, flowing a current in the bit line BL and detecting a tunnel current change caused by a magnetoresistance effect with the sense line 116. When the magnetization direction of the memory layer 135 and the counterpart of the pinned magnetic layer 133 are the same, a low-resistance state results (this state represents, for example, "0"), and when the magnetization direction of the memory layer 135 and the counterpart of the pinned magnetic layer 133 are antiparallel, a high-resistance state results (this state represents, for example, "1").

A manufacturing method of the conventional MRAM shown in FIG. 40 will be outlined below with reference to FIGS. 34A, 34B and 35 to 40 showing schematic partial cross-sectional views of the semiconductor substrate and the like.

[Step-10]

First, a MOS-type FET to work as a transistor for selection TR is formed in the semiconductor substrate 110 composed of a silicon semiconductor substrate. Then, a lower layer of the first insulating interlayer is formed on the entire surface, and then, an opening portion is formed through the lower layer of the first insulating interlayer above the source/drain region 114A by a lithography technique and an RIE method. Then, a polysilicon layer doped with an impurity is formed on the lower layer of the first insulating interlayer including an inside of the opening portion by a CVD method. Then, the polysilicon layer on the lower layer of the first insulating interlayer is patterned, whereby the sense line 116 can be formed on the lower layer of the first insulating interlayer. The sense line 116 and the source/drain region 114A are connected to each other through the contact hole 115 formed through the lower layer of the first insulating interlayer. Then, an upper layer of the first insulating interlayer is formed on the entire surface. The lower layer and the upper layer of the first insulating interlayer will be simply called "first insulating interlayer 121" all together hereinafter.

[Step-20]

Then, a first opening portion 122 is formed through the first insulating interlayer 121 above the source/drain region 114B by an RIE method, and then, the first connecting hole 123 connected to the source/drain region 114B of the transistor for selection TR is formed in the first opening portion 122.

Then, the write-in word line RWL is formed on the first insulating interlayer 121, and at the same time, the landing pad 124 is formed on the top surface of the first connecting hole 123. Then, the second insulating interlayer 125 is formed on the entire surface. In this manner, a structure shown in FIG. 34A can be obtained.

[Step-30]

Then, a resist layer 140 having an opening 141 formed above the landing pad 124 is formed on the second insulating interlayer 125 by a lithography technique (see FIG. 34B). Then, the second insulating interlayer 125 is etched with using the resist layer 140 as a mask, to form a second opening portion 126 through the second insulating interlayer 125, and then, the resist layer 140 is removed by an ashing technique. In this manner, a structure shown in FIG. 35 can be obtained. Then, for attaining excellent contact, the landing pad 124 exposed in the bottom of the second opening portion 126 is argon-sputtered.

[Step-40]

Then, the barrier layer 131, the anti-ferromagnetic layer 132, the pinned magnetic layer 133, the tunnel barrier 134, the memory layer 135 and the top coating film 136 are consecutively formed on the entire surface including an inside of the second opening portion 126. All the layers from the barrier layer 131 to the top coating film 136 are deposited on the side surface and bottom surface of the second opening portion 126 as well. In this manner, a structure shown in FIG. 36 can be obtained.

[Step-50]

Then, the top coating film 136, the memory layer 135 and the tunnel barrier 134 are patterned by a lithography technique and an RIE method, whereby the pinned magnetic layer 133, the anti-ferromagnetic layer 132 and the barrier layer 131 are allowed to remain, and further, the second connecting hole 127 formed of the extending portions of the barrier layer 131, the anti-ferromagnetic layer 132 and the pinned magnetic layer 133 can be obtained. In this manner, a structure shown in FIG. 37 can be obtained.

[Step-60]

Then, the pinned magnetic layer 133, the anti-ferromagnetic layer 132 and the barrier layer 131 are patterned (see FIG. 38), the third insulating interlayer 128 is formed on the entire surface, and then, the third insulating interlayer 128 is flattened by a CMP method, to expose the top coating film 136 (see FIG. 39). Then, the bit line BL is formed on the third insulating interlayer 128. The bit line BL is connected to the top coating film 136 and extends in the second direction (leftward and rightward on the drawing) crossing the first direction (see FIG. 40). In this case, peripheral circuits (not shown) and a bonding pad region (not shown) are formed together. Further, a silicon nitride film (not shown) is deposited on the entire surface by a plasma CVD method, and the bonding pad portion (not shown) is opened in the silicon nitride film, to complete the manufacturing process of the MRAM.

The MRAM has advantages that a higher speed and a higher integration degree can be easily accomplished as described already. However, the above process has the following problems, which will be explained below.

The second insulating interlayer 125 as a substratum for the tunnel magnetoresistance device 130 is required to have a very high flatness of several angstroms or less. The magnetization directions in the memory layer 135 and the pinned magnetic layer 133 of the tunnel magnetoresistance device 130 are required to be in parallel with the surface of the tunnel magnetoresistance device 130. However, when a convexoconcave shape exists in the surface of the second insulating interlayer 125, the memory layer 135 or the pinned magnetic layer 133 comes into a convexoconcave state, and the magnetization of the memory layer 135 or the pinned magnetic layer 133 comes to have a vertical component, so that the property of the tunnel magnetoresistance device 130 is deteriorated, or that the fluctuation of the property of the tunnel magnetoresistance device 130 is widened. Further, when a convexoconcave shape exists in the surface of the second insulating interlayer 125, the thickness of the tunnel barrier 134, which thickness is very small, as small as approximately 1 nm, varies, and the property of the tunnel magnetoresistance device 130 varies.

When the resist layer 140 on the second insulating interlayer 125 is removed in the above [Step-30], a convexoconcave shape is formed in the second insulating interlayer 125. Further, the argon sputtering treatment for the landing pad 124 forms a convexoconcave shape in the second insulating interlayer 125 as well. FIG. 35 schematically shows a state where the surface of the second insulating interlayer 125 is roughened.

Further, the second connecting hole 127 comprises the extending portions of the barrier layer 131, the anti-ferromagnetic layer 132 and the pinned magnetic layer 133. Each layer constituting the tunnel magnetoresistance device 130 has a small thickness, and a sputtering apparatus for forming each layer is specified to have high accuracy, to form a flat layer and to prevent a fluctuation of the layer thickness.

Sputtering thereof is also carried out at room temperature. There is therefore caused a problem that the step coverage of the second opening portion 126 is poor as compared with the step coverage attained when a general sputtering apparatus is used, so that step cut or breakage is liable to take place in the pinned magnetic layer 133, the anti-ferromagnetic layer 132 and the barrier layer 131.

OBJECT AND SUMMARY OF THE INVENTION

It is therefore an object of the present invention to provide a nonvolatile magnetic memory device having a structure in which various layers for constituting the tunnel magnetoresistance device can be reliably flattened and the connecting hole connecting the tunnel magnetoresistance device and the transistor for selection can be imparted with high reliability, and a manufacturing method thereof.

The nonvolatile magnetic memory device (more specifically, TMR-type MRAM) of the present invention for achieving the above object is a nonvolatile magnetic memory device comprising;

(a) a transistor for selection, formed in a semiconductor substrate, (b) a first insulating interlayer covering the transistor for selection, (c) a first connecting hole formed in a first opening portion formed through the first insulating interlayer, and connected to the transistor for selection, (d) a first wiring being formed on the first insulating interlayer and extending in a first direction, (e) a second insulating interlayer covering the first insulating interlayer and the first wiring, (f) a tunnel magnetoresistance device being formed on the second insulating interlayer and comprising a tunnel barrier and two ferromagnetic layers, said tunnel barrier being sandwiched between said two ferromagnetic layers, (g) a third insulating interlayer covering the tunnel magnetoresistance device and the second insulating interlayer, (h) a second wiring being formed on the third insulating interlayer, being electrically connected to one end of the tunnel magnetoresistance device and extending in a second direction different from the first direction (for example, crossing the first direction at right angles), and (i) a second connecting hole formed in a second opening portion formed through the second insulating interlayer, and connected to the first connecting hole, in which an end face of an extending portion of the other end of the tunnel magnetoresistance device is in contact with the second connecting hole.

In the nonvolatile magnetic memory device of the present invention, the second wiring is electrically connected to one end of the tunnel magnetoresistance device, and this constitution includes an embodiment in which the second wiring is indirectly connected to one end of the tunnel magnetoresistance device.

The manufacturing method of a nonvolatile magnetic memory device (more specifically, TMR-type MRAM), according to a first aspect of the present invention for achieving the above object, is a manufacturing method of the nonvolatile magnetic memory device of the present invention, comprising the steps of;

(A) forming a transistor for selection, in a semiconductor substrate, (B) forming a first insulating interlayer on the entire surface, (C) forming a first opening portion through the first insulating interlayer, and forming a first connecting hole connected to the transistor for selection in the first opening portion, (D) forming a first wiring extending in a first direction on the first insulating interlayer, (E) forming a second insulating interlayer on the entire surface, (F) forming a stacking structure constituted at least of a first ferromagnetic layer, a tunnel barrier and a second ferromagnetic layer on the second insulating interlayer, (G) forming a second opening portion in those portions of the stacking structure and the second insulating interlayer which portions are positioned above the first connecting hole, (H) forming an electrically conductive layer on the entire surface including an inside of the second opening portion, (I) patterning the electrically conductive layer, the second ferromagnetic layer and the tunnel barrier, thereby to obtain a second connecting hole connected to the first connecting hole in the second opening portion, (J) patterning the first ferromagnetic layer, thereby to obtain a tunnel magnetoresistance device having the tunnel barrier sandwiched between the first and second ferromagnetic layers, and also to obtain an extending portion of the first ferromagnetic layer, said extending portion having an end face being in contact with the second connecting hole, (K) forming a third insulating interlayer on the entire surface, and (L) forming a second wiring on the third insulating interlayer, said second wiring being electrically connected to the second ferromagnetic layer and extending in a second direction different from the first direction (for example, crossing the first direction at right angles).

In the manufacturing method of a nonvolatile magnetic memory device according to the first aspect of the present invention, when the first ferromagnetic layer is constituted of an anti-ferromagnetic layer and a pinned magnetic layer which are positioned in this order from below, as will be described later, the pinned magnetic layer may be patterned in addition to the electrically conductive layer, the second ferromagnetic layer and the tunnel barrier in the above step (I). In this case, the first ferromagnetic layer is patterned in the above step (J), and specifically, the anti-ferromagnetic layer is patterned, and there can be obtained the extending portion of the first ferromagnetic layer (more specifically, the extending portion of the anti-ferromagnetic layer) which extending portion has an end face being in contact with the second connecting hole.

The manufacturing method of a nonvolatile magnetic memory device (more specifically, TMR-type MRAM), according to a second aspect of the present invention for achieving the above object, is a manufacturing method of the nonvolatile magnetic memory device of the present invention, comprising the steps of;

(A) forming a transistor for selection, in a semiconductor substrate, (B) forming a first insulating interlayer on the entire surface, (C) forming a first opening portion through the first insulating interlayer, and forming a first connecting hole connected to the transistor for selection in the first opening portion, (D) forming a first wiring extending in a first direction on the first insulating interlayer, (E) forming a second insulating interlayer on the entire surface, (F) forming a stacking structure constituted at least of a first ferromagnetic layer, a tunnel barrier and a second ferromagnetic layer on the second insulating interlayer, (G) patterning the second ferromagnetic layer and the tunnel barrier, (H) forming a second opening portion through those portions of the first ferromagnetic layer and the second insulating interlayer which portions are positioned above the first connecting hole, (I) forming an electrically conductive layer on the entire surface including an inside of the second opening portion, (J) patterning the electrically conductive layer, thereby to form a second connecting hole connected to the first connecting hole in the second opening portion, (K) patterning the first ferromagnetic layer, thereby to obtain a tunnel magnetoresistance device having the tunnel barrier sandwiched between the first and second ferromagnetic layers, (L) forming a third insulating interlayer on the entire surface, and (M) forming a second wiring on the third insulating interlayer, said second wiring being electrically connected to the second ferromagnetic layer and extending in a second direction different from the first direction (for example, crossing the first direction at right angles).

In the manufacturing method of a nonvolatile magnetic memory device according to the second aspect of the present invention, when the first ferromagnetic layer is constituted, for example, of an anti-ferromagnetic layer and a pinned magnetic layer which are positioned in this order from below, as will be described later, the pinned magnetic layer may be patterned in addition to the second ferromagnetic layer and the tunnel barrier in the above step (G). In this case, specifically, the second opening portion is formed through those portions of the anti-ferromagnetic layer and the second insulating interlayer which portions are positioned above the first connecting hole in the above step (H). And, the first ferromagnetic layer is patterned in the step (K), and specifically, the anti-ferromagnetic layer is patterned. In this manner, there can be obtained the extending portion of the first ferromagnetic layer (specifically, the extending portion of the anti-ferromagnetic layer) which extending portion has an end face being in contact with the second connecting hole.

In the manufacturing method of a nonvolatile magnetic memory device according to the second aspect of the present invention, there may be employed a constitution in which the above step (G) is followed by a step in which the first ferromagnetic layer is patterned, thereby to obtain the tunnel magnetoresistance device having the tunnel barrier sandwiched between the first and second ferromagnetic layers, and also to obtain the extending portion of the first ferromagnetic layer, the second opening portion is formed through those portions of the extending portion of the first ferromagnetic layer and the second insulating interlayer which portions are positioned above the first connecting hole in the above step (H), and the above step (J) is followed by the step (L) while the above step (K) is omitted.

The above manufacturing method of a nonvolatile magnetic memory device will be referred to as "manufacturing method of a nonvolatile magnetic memory device according to a third aspect of the present invention" for convenience.

In the manufacturing method of a nonvolatile magnetic memory device according to any one of the first to third aspects of the present invention, the second wiring is electrically connected to the second ferromagnetic layer, and, this constitution includes an embodiment in which the second wiring is indirectly connected to the second ferromagnetic layer.

In the nonvolatile magnetic memory device of the present invention and the manufacturing method of a nonvolatile magnetic memory device according to any one of the first to third aspects of the present invention (these will be sometimes simply referred to as "the present invention" hereinafter), preferably, the first ferromagnetic layer more specifically has a two-layer structure of an anti-ferromagnetic layer and a pinned magnetic layer (called a reference layer as well) which are positioned in this order from below, whereby the first ferromagnetic layer can have an intense unidirectional magnetic anisotropy due to an exchange interaction working between these two layers. The second ferromagnetic layer of which the magnetization direction relatively easily rotates is also called a free layer or a memory layer. The tunnel barrier works to disconnect a magnetic coupling between the second ferromagnetic layer (memory layer) and the pinned magnetic layer and to flow a tunnel current.

The pinned magnetic layer (reference layer) and the second ferromagnetic layer (memory layer or free layer) can be constituted, for example, of a ferromagnetic material composed of a transition metal magnetic element, specifically, such as nickel (Ni), iron (Fe) or cobalt (Co) or a ferromagnetic material containing an alloy of these elements (for example, Co—Fe, Co—Fe—Ni, Ni—Fe or the like) as a main component. Further, a so-called half-metallic ferromagnetic material or an amorphous ferromagnetic material such as CoFe—B may be also used. Examples of the material for constituting the anti-ferromagnetic layer include an iron-manganese alloy, a nickel-manganese alloy, a platinum-manganese alloy, an iridium-manganese alloy, a rhodium-manganese alloy, a cobalt oxide and a nickel oxide. The above layers can be formed by a physical vapor deposition (PVD) method such as a sputtering method, an ion beam deposition method and a vacuum vapor deposition method, or a CVD method typified such as an ALD (Atomic Layer Deposition) method.

The insulating material for constituting the tunnel barrier includes an aluminum oxide ($AlO_x$), an aluminum nitride (AlN), a magnesium oxide (MgO), a magnesium nitride, a silicon oxide and a silicon nitride. Further, it also includes Ge, NiO, $CdO_x$, $HfO_2$, $Ta_2O_5$, BN and ZnS. The tunnel barrier can be obtained, for example, by oxidizing or nitriding a metal film formed by a sputtering method. More specifically, when an aluminum oxide ($AlO_x$) is used as an insulating material for constituting the tunnel barrier, the method for forming the tunnel barrier includes a method in which aluminum formed by a sputtering method is oxidized in atmosphere, a method in which aluminum formed by a sputtering method is plasma-oxidized, a method in which aluminum formed by a sputtering method is oxidized with IPC plasma, a method in which aluminum formed by a sputtering method is subject to natural oxidation in oxygen gas, a method in which aluminum formed by a sputtering method is oxidized with oxygen radicals, a method in which aluminum formed by a sputtering method is irradiated with ultraviolet ray while it is subjected to natural oxidation in oxygen gas, a method in which aluminum is formed by a reactive sputtering method, and a method in which an aluminum oxide is formed by a sputtering method. Alternatively, the tunnel barrier can be formed by an ALD method.

The first wiring (write-in word line) or the second wiring (bit line) is made, for example, of aluminum, an aluminum alloy such as Al—Cu, or copper (Cu), and they can be formed by a PVD method such as a sputtering method, a chemical vapor deposition method (CVD method), or a plating method typified by an electric plating method. Further, the electrically conductive layer is made, for example, of aluminum, an aluminum alloy such as Al—Cu, copper (Cu), Ta, TaN, Ti, TiN, W, WN or ruthenium (Ru), and it can be formed by a PVD method such as a sputtering method, a CVD method, or a plating method. The second connecting hole is constituted of the above electrically conductive layer.

The first connecting hole can be constituted of a polysilicon doped with an impurity, and a refractory metal or metal silicide such as W, Ti, Pt, Pd, Cu, TiW, TiNW, $WSi_2$ or $MoSi_2$. It can be formed by a CVD method, or a PVD method such as a sputtering method.

Patterning or selective removal of the stacking structure can be carried out, for example, by a reactive ion etching (RIE) method or an ion milling method. The stacking structure can be also patterned by a so-called lift-off method as required.

The transistor for selection can be constituted, for example, of a well-known MIS-type FET or MOS-type FET or a bipolar transistor.

Examples of the material for constituting the various insulating interlayer include silicon oxide ($SiO_2$), silicon nitride (SiN), SiON, SOG, NSG, BPSG, PSG, BSG, FSG, SiOC, SiC, an organic film (so-called Low-k material), LTO or alumina ($Al_2O_3$).

In the manufacturing method of a nonvolatile magnetic memory device according to the first aspect of the present invention, the step (F) is followed by the step (G), so that the occurrence of a convexoconcave shape in the surface of the second insulating interlayer can be reliably prevented. Further, the second connecting hole is formed in the step (H) and the step (I), so that high reliability can be imparted to the second connecting hole electrically connecting the tunnel magnetoresistance device and the transistor for selection.

In the manufacturing method of a nonvolatile magnetic memory device according to the second or third aspect of the present invention, the step (F) is followed by the step (H), so that the occurrence of a convexoconcave shape in the surface of the second insulating interlayer can be reliably prevented. Further, the second connecting hole is formed in the step (I) and the step (J), so that high reliability can be imparted to the second connecting hole electrically connecting the tunnel magnetoresistance device and the transistor for selection.

BRIEF DESCRIPTION OF THE DRAWINGS

FIG. 1, is a schematic partial cross-sectional view of the semiconductor substrate, etc., for explaining the manufacturing method of an MRAM type nonvolatile magnetic memory device in Example 1.

FIG. 2, is a schematic partial cross-sectional view of the semiconductor substrate, etc., for explaining the manufacturing method of an MRAM type nonvolatile magnetic memory device in Example 1.

FIG. 3, is a schematic partial cross-sectional view of the semiconductor substrate, etc., for explaining the manufacturing method of an MRAM type nonvolatile magnetic memory device in Example 1.

FIG. 4, is a schematic partial cross-sectional view of the semiconductor substrate, etc., for explaining the manufacturing method of an MRAM type nonvolatile magnetic memory device in Example 1.

FIG. 5, is a schematic partial cross-sectional view of the semiconductor substrate, etc., for explaining the manufacturing method of an MRAM type nonvolatile magnetic memory device in Example 1.

FIG. 6, is a schematic partial cross-sectional view of the semiconductor substrate, etc., for explaining the manufacturing method of an MRAM type nonvolatile magnetic memory device in Example 1.

FIG. 7, is a schematic partial cross-sectional view of the semiconductor substrate, etc., for explaining the manufacturing method of an MRAM type nonvolatile magnetic memory device in Example 1.

FIG. 9, is a schematic partial cross-sectional view of the semiconductor substrate, etc., for explaining the manufacturing method of an MRAM type nonvolatile magnetic memory device in Example 2.

FIG. 10, is a schematic partial cross-sectional view of the semiconductor substrate, etc., for explaining the manufacturing method of an MRAM type nonvolatile magnetic memory device in Example 2.

FIG. 12, is a schematic partial cross-sectional view of the semiconductor substrate, etc., for explaining the manufacturing method of an MRAM type nonvolatile magnetic memory device in Example 3.

FIG. 13, is a schematic partial cross-sectional view of the semiconductor substrate, etc., for explaining the manufacturing method of an MRAM type nonvolatile magnetic memory device in Example 3.

FIG. 14, is a schematic partial cross-sectional view of the semiconductor substrate, etc., for explaining the manufacturing method of an MRAM type nonvolatile magnetic memory device in Example 3.

FIG. 15, is a schematic partial cross-sectional view of the semiconductor substrate, etc., for explaining the manufacturing method of an MRAM type nonvolatile magnetic memory device in Example 3.

FIG. 16, is a schematic partial cross-sectional view of the semiconductor substrate, etc., for explaining the manufacturing method of an MRAM type nonvolatile magnetic memory device in Example 3.

FIG. 18, is a schematic partial cross-sectional view of the semiconductor substrate, etc., for explaining the manufacturing method of an MRAM type nonvolatile magnetic memory device in Example 4.

FIG. 19, is a schematic partial cross-sectional view of the semiconductor substrate, etc., for explaining the manufacturing method of an MRAM type nonvolatile magnetic memory device in Example 4.

FIG. 20, is a schematic partial cross-sectional view of the semiconductor substrate, etc., for explaining the manufacturing method of an MRAM type nonvolatile magnetic memory device in Example 4.

FIG. 21, is a schematic partial cross-sectional view of the semiconductor substrate, etc., for explaining the manufacturing method of an MRAM type nonvolatile magnetic memory device in Example 4.

FIG. 22, is a schematic partial cross-sectional view of the semiconductor substrate, etc., for explaining the manufacturing method of an MRAM type nonvolatile magnetic memory device in Example 4.

FIG. 24, is a schematic partial cross-sectional view of the semiconductor substrate, etc., for explaining the manufacturing method of an MRAM type nonvolatile magnetic memory device in Example 5.

FIG. 25, is a schematic partial cross-sectional view of the semiconductor substrate, etc., for explaining the manufacturing method of an MRAM type nonvolatile magnetic memory device in Example 5.

FIG. 26, is a schematic partial cross-sectional view of the semiconductor substrate, etc., for explaining the manufacturing method of an MRAM type nonvolatile magnetic memory device in Example 5.

FIG. 27, is a schematic partial cross-sectional view of the semiconductor substrate, etc., for explaining the manufacturing method of an MRAM type nonvolatile magnetic memory device in Example 5.

FIG. 29, is a schematic partial cross-sectional view of the semiconductor substrate, etc., for explaining the manufacturing method of an MRAM type nonvolatile magnetic memory device in Example 6.

FIG. 30, is a schematic partial cross-sectional view of the semiconductor substrate, etc., for explaining the manufacturing method of an MRAM type nonvolatile magnetic memory device in Example 6.

FIG. 31, is a schematic partial cross-sectional view of the semiconductor substrate, etc., for explaining the manufacturing method of an MRAM type nonvolatile magnetic memory device in Example 6.

FIG. 32, is a schematic partial cross-sectional view of the semiconductor substrate, etc., for explaining the manufacturing method of an MRAM type nonvolatile magnetic memory device in Example 6.

FIG. 34B, is a schematic partial cross-sectional view of the semiconductor substrate, etc., for explaining the manufacturing method of a conventional MRAM type nonvolatile magnetic memory device.

FIG. 35, is a schematic partial cross-sectional view of the semiconductor substrate, etc., for explaining the manufacturing method of a conventional MRAM type nonvolatile magnetic memory device.

FIG. 36, is a schematic partial cross-sectional view of the semiconductor substrate, etc., for explaining the manufacturing method of a conventional MRAM type nonvolatile magnetic memory device.

FIG. 37, is a schematic partial cross-sectional view of the semiconductor substrate, etc., for explaining the manufacturing method of a conventional MRAM type nonvolatile magnetic memory device.

FIG. 38, is a schematic partial cross-sectional view of the semiconductor substrate, etc., for explaining the manufacturing method of a conventional MRAM type nonvolatile magnetic memory device.

FIG. 39, is a schematic partial cross-sectional view of the semiconductor substrate, etc., for explaining the manufacturing method of a conventional MRAM type nonvolatile magnetic memory device.

DESCRIPTION OF THE PREFERRED EMBODIMENTS

The present invention will be explained on the basis of Example with reference to drawings.

EXAMPLE 1

Figure 8:
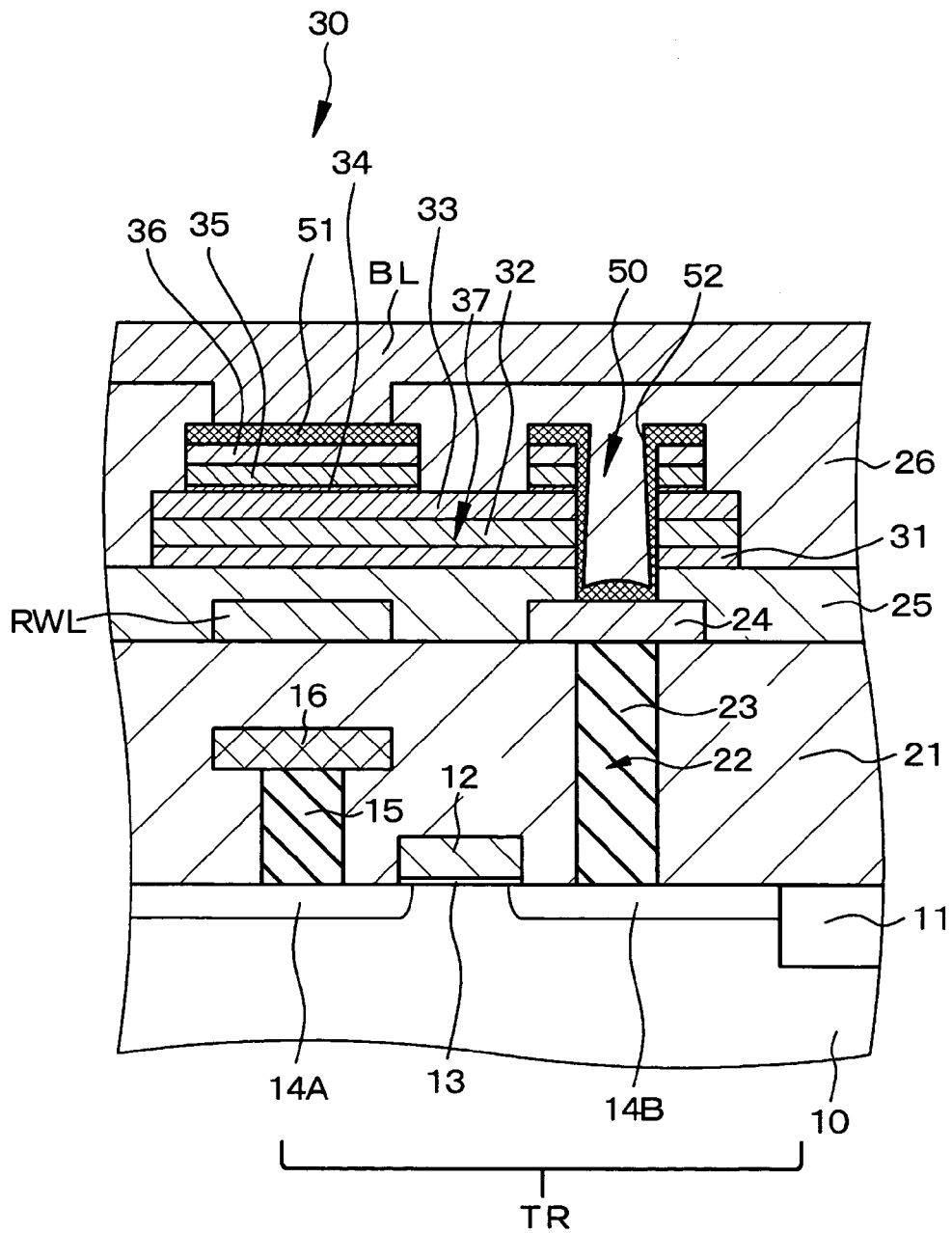
FIG. 8, following

Example 1 is concerned with the nonvolatile magnetic memory device (to be referred to as "MRAM" hereinafter) of the present invention and the manufacturing method of an MRAM according to the first aspect of the present invention. FIG. 8 shows a schematic partial cross-sectional view of the TMR-type MRAM of Example 1.

This MRAM has a transistor for selection TR, a first insulating interlayer 21, a first connecting hole 23, a first wiring (write-in word line RWL), a second insulating interlayer 25, a tunnel magnetoresistance device 30, a third insulating interlayer 26, a second wiring (bit line BL), and a second connecting hole 52.

The transistor for selection TR is formed in a semiconductor substrate 10 and comprises a MOS-type FET. More specifically, the transistor for selection TR is formed in an active region surrounded by a device isolation region 11, and comprises a gate electrode 12, a gate insulating film 13 and source/drain regions 14A and 14B. The first insulating interlayer 21 made, for example, of $SiO_2$ and BPSG covers the transistor for selection TR. The first connecting hole 23 made of a tungsten plug is formed in a first opening portion 22 formed through the first insulating interlayer 21, and is connected to one source/drain region 14B of the transistor for selection TR. The first connecting hole 23 is further connected to a landing pad 24 formed on the first insulating interlayer 21. The first wiring (write-in word line RWL) is constituted of Cu, is formed on the first insulating interlayer 21, and extends in a first direction (direction perpendicular to the paper surface of the drawing). The second insulating interlayer 25 composed of $SiO_2$ covers the first insulating interlayer 21 and the write-in word line RWL. The other source/drain region 14A of the transistor for selection TR is connected to a sense line 16 through a contact hole 15.

The tunnel magnetoresistance device 30 is formed on the second insulating interlayer 25 and has a stacking structure constituted of a first ferromagnetic layer, a tunnel barrier 34 made of $AlO_x$ and a second ferromagnetic layer 35 (also called a free layer or a memory layer) made of an Ni—Fe alloy which are positioned in this order from below. More specifically, the first ferromagnetic layer has a two-layer structure of an anti-ferromagnetic layer 32 made of an Fe—Mn alloy and a pinned magnetic layer 33 made of an Ni—Fe alloy which are positioned in this order from below. The above pinned magnetic layer 33 has its magnetization direction pinned by an exchange coupling with the anti-ferromagnetic layer 32. Due to an externally applied magnetic field, the magnetization direction of the second ferromagnetic layer (memory layer) 35 is changed to the direction in parallel or antiparallel with the magnetization direction of the pinned magnetic layer 33. A barrier layer 31 made of titanium nitride, tantalum or tantalum nitride is formed between the anti-ferromagnetic layer 32 and the second insulating interlayer 25. Reference numeral 36 indicates a top coating film made of the same material as that of the barrier layer 31. The top coating film 36 works to prevent mutual diffusion of atoms constituting the bit line BL and atoms constituting the second ferromagnetic layer (memory layer) 35, to reduce a contact resistance and to prevent oxidation of the second ferromagnetic layer (memory layer) 35.

The third insulating interlayer 26 composed of $SiO_2$ covers the tunnel magnetoresistance device 30, the second insulating interlayer 25 and extending portions 37 of the pinned magnetic layer 33, the anti-ferromagnetic layer 32 and the barrier layer 31. The bit line BL as a second wiring is formed on the third insulating interlayer 26, is electrically connected to one end of the tunnel magnetoresistance device 30 [more specifically, the second ferromagnetic layer (memory layer) 35], and extends in a second direction different from the first direction (specifically, the direction crossing the first direction at right angles).

The second connecting hole 52 composed of Ta is formed in a second opening portion 50 formed through the second insulating interlayer 25 and is connected to the first connecting hole 23. More specifically, the second connecting hole 52 is in contact with the landing pad 24. The top portion of the second connecting hole 52 is formed on the top coating film 36.

An end face of the extending portion 37 of other end of the tunnel magnetoresistance device (more specifically, the end faces of the extending portions of the pinned magnetic layer 33, the anti-ferromagnetic layer 32 and the barrier layer 31 which portions are extending on the second insulating interlayer 25) is in contact with the second connecting hole 52.

The operation and array constitution of the MRAM in Example 1 or any one of Examples 2 to 6 to be described later are basically the same as the operation (write and readout operations) and array constitution of a conventional MRAM.

The manufacturing method of an MRAM in Example 1 will be explained below with reference to FIGS. 1 to 8 which show schematic partial cross-sectional views of the semiconductor substrate 10 and the like.

[Step-100]

The MOS-type FFT to work as a transistor for selection TR is formed in the semiconductor substrate 10 made of a silicon semiconductor substrate. For this purpose, the device isolation region 11 having, for example, a trench structure is formed by a known method. The device isolation region may have a LOCOS structure or a combination of LOCOS and trench structures. Then, the surface of the semiconductor substrate 10 is oxidized, for example by a pyrogenic method, to form the gate insulating film 13. Then, a polysilicon layer doped with an impurity is formed on the entire surface by a CVD method, and then, the polysilicon layer is patterned to form the gate electrode 12. The gate electrode 12 may be constituted of a polycide or a metal silicide instead of the polysilicon layer. Then, the semiconductor substrate 10 is ion-implanted, to form an LDD structure (not shown). Then, an $SiO_2$ layer is formed on the entire surface by a CVD method, and the $SiO_2$ layer is etched back to form a side-wall (not shown) on each side surface of the gate electrode 12. Then, the semiconductor substrate 10 is ion-implanted and the ion-implanted impurity is annealed for activation thereof, to form the source/drain regions 14A and 14B.

[Step-105]

Then, a lower layer, made of $SiO_2$, of the first insulating interlayer is formed on the entire surface by a CVD method, and then, the lower layer of the first insulating interlayer is polished by a chemical/mechanical polishing method (CMP method). Then, an opening portion is formed through the lower layer of the first insulating interlayer above the source/drain region 14A by lithography and RIE methods, and then, a polysilicon layer doped with an impurity is formed on the lower layer of the first insulating interlayer including an inside of the opening portion. Then, the polysilicon layer on the lower layer of the first insulating interlayer is patterned, whereby the sense line 16 can be formed on the lower layer of the first insulating interlayer. The sense line 16 and the source/drain region 14A are connected to each other through the contact hole 15 formed through the lower layer of the first insulating interlayer. Then, an upper layer, made of BPSG, of the first insulating interlayer is formed on the entire surface by a CVD method. After the formation of the upper layer, made of BPSG, of the first insulating interlayer, preferably, the upper layer of the first insulating interlayer is allowed to reflow in a nitrogen gas atmosphere at 900° C. for 20 minutes. Further, desirably, the top surface of the upper layer of the first insulating interlayer is chemically and mechanically polished, for example, by a CMP method to flatten the upper layer of the first insulating interlayer, or the upper layer of the first insulating interlayer is flattened by a resist-etch-back method, as required. The lower layer and the upper layer of the first insulating interlayer will be collectively and simply referred to as the first insulating interlayer 21.

[Step-110]

Then, the first opening portion 22 is formed through the first insulating interlayer 21 above the source/drain region 14B by an RIE method, and then, the first connecting hole 23 connected to the source/drain region 14B of the transistor for selection TR is formed in the first opening portion 22. The top surface of the first connecting hole 23 is nearly on level with the surface of the first insulating interlayer 21. The first opening portion 22 can be filled with a tungsten plug by, for example, a blanket tungsten CVD method to form the first connecting hole 23. Before filling the first opening portion 22 with tungsten, preferably, a Ti layer and a TiN layer are consecutively formed on the first insulating interlayer 21 including an inside of the first opening portion 22, for example, by magnetron sputtering methods. The reason for forming the above Ti layer and TiN layer is that an ohmic low-contact resistance is obtained, that damage of the semiconductor substrate 10 by the blanket tungsten CVD method is prevented, and that the adhesion of the tungsten is improved. In the drawing, showing of the Ti layer and TiN layer is omitted. The tungsten layer, the TiN layer and the Ti layer on the first insulating interlayer 21 may be removed by a CMP method. Further, the above tungsten may be replaced with a polysilicon doped with an impurity.

[Step-115]

Then, a Cu layer is formed on the first insulating interlayer 21 by a sputtering method, and the Cu layer is patterned to form the first wiring (write-in word line RWL) and the landing pad 24.

The first wiring (write-in word line RWL) and the landing pad 24 may be formed by a so-called damascene method. That is, an insulating film is formed on the first insulating interlayer 21 and concave portions are formed in those portions of the insulating film in which portions the first wiring (write-in word line RWL) and the landing pad 24 are to be formed. Then, a 20 nm thick Ta film and a 0.1 μm copper film are consecutively formed by sputtering methods, and then, the concave portions are filled with a Cu layer by carrying out Cu plating. Then, the Cu layer, the copper film and the Ta film on the insulating film are removed, for example, by a CMP method.

[Step-120]

Figure 1:
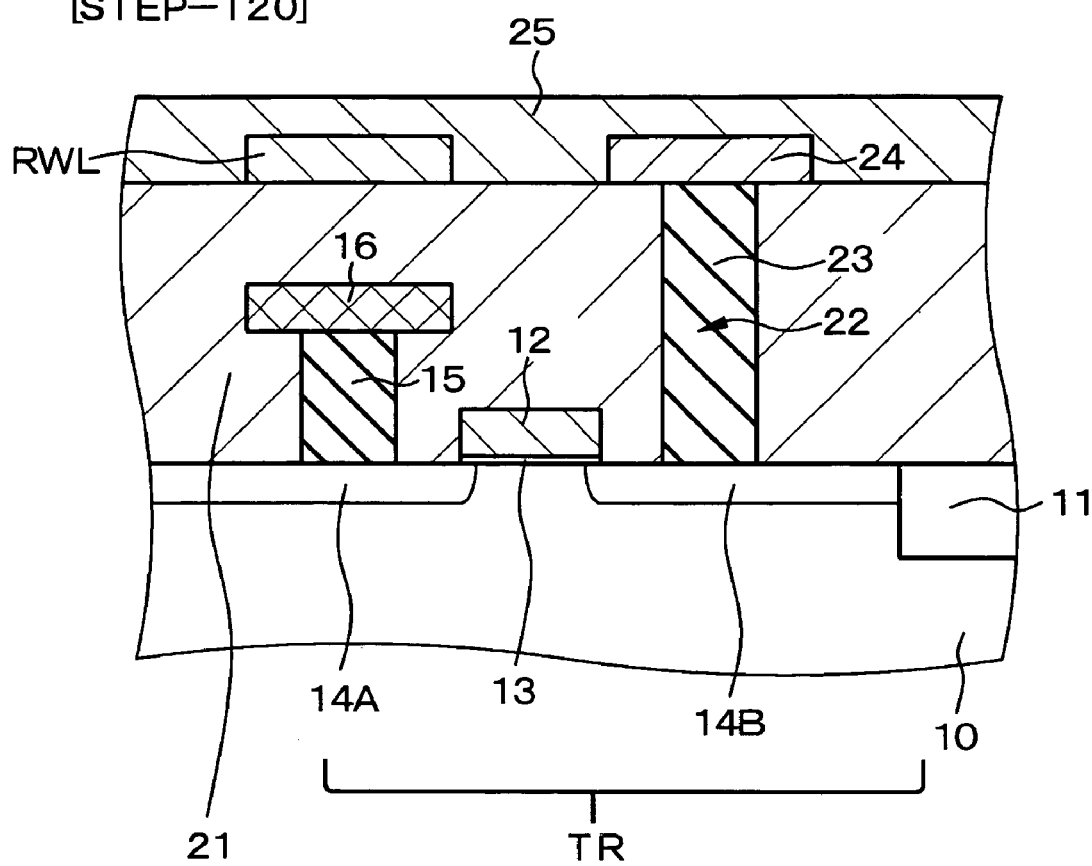
FIG. 1 is a schematic partial cross-sectional view of a semiconductor substrate, etc., for explaining a manufacturing method of an MRAM type nonvolatile magnetic memory device in Example 1.
Figure 2:
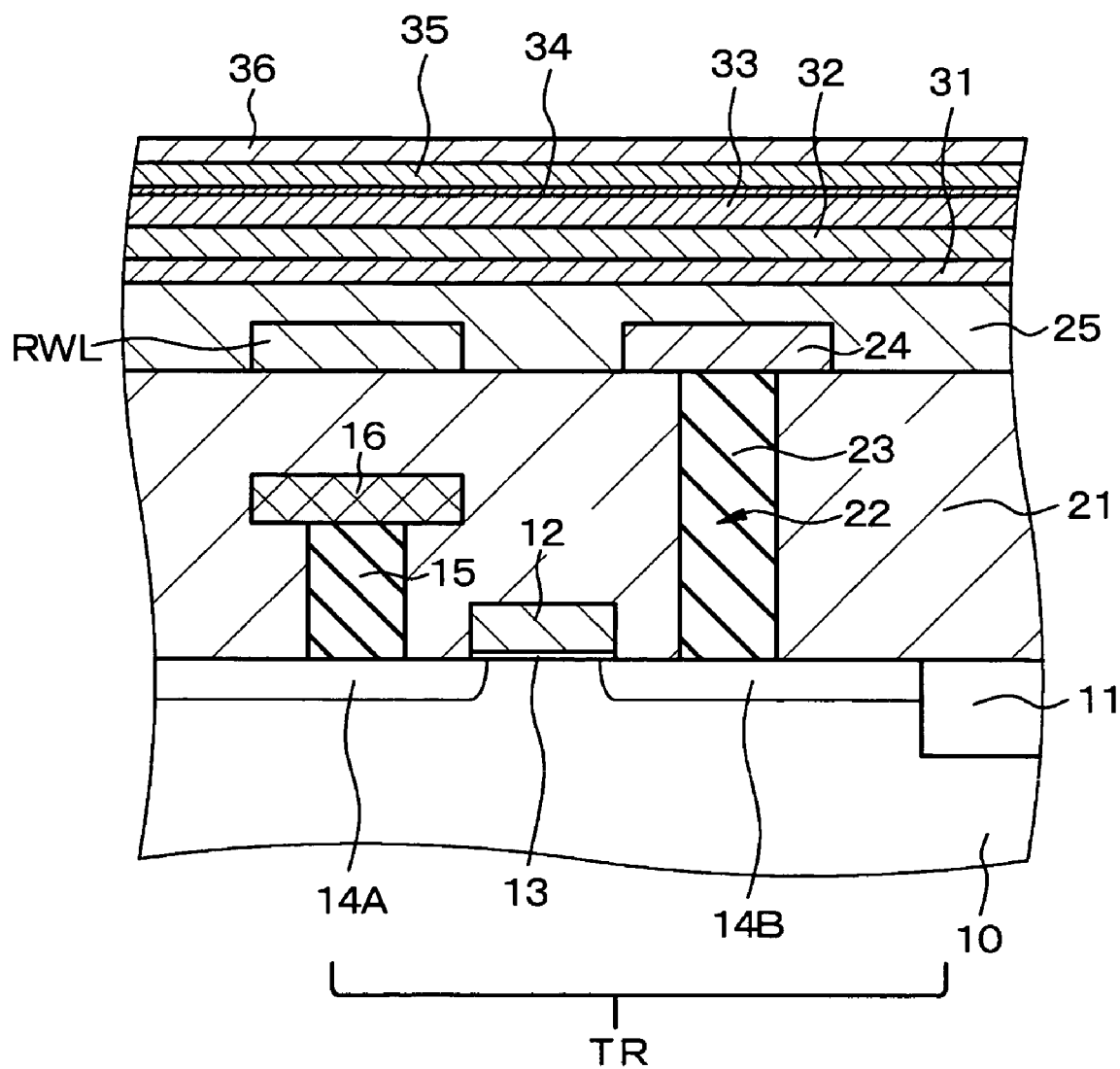
FIG. 2, following

Then, the second insulating interlayer 25 made of $SiO_2$ is formed on the entire surface by a CVD method, for example, so as to have a thickness of 50 nm on the first wiring (write-in word line RWL) (see FIG. 1). In this state, the surface of the second insulating interlayer 25 is fully flat and smooth. The second insulating interlayer 25 may be flattened, for example, by a CMP method, as required.

[Step-125]

Then, on the second insulating interlayer 25, there is formed a stacking structure constituted at least of the first ferromagnetic layer, the tunnel barrier 34 and the second ferromagnetic layer (memory layer) 35.

Specifically, the barrier layer 31, the anti-ferromagnetic layer 32, the pinned magnetic layer 33, the tunnel barrier 34, the second ferromagnetic layer (memory layer) 35 and the top coating film 36 made of the same material as that of the barrier layer 31 are consecutively formed by PVD methods. In this manner, a structure shown in FIG. 2 can be obtained. The tunnel barrier 34 is constituted, for example, of $AlO_x$. Since the tunnel barrier 34 has a very small thickness of 0.5 nm to 5 nm, so that it is preferred to form it by forming an aluminum thin film by an ALD method or a sputtering method, and then, plasma-oxidizing the aluminum thin film. However, the method of forming the tunnel barrier 34 shall not be limited thereto.

[Step-130]

Figure 3:
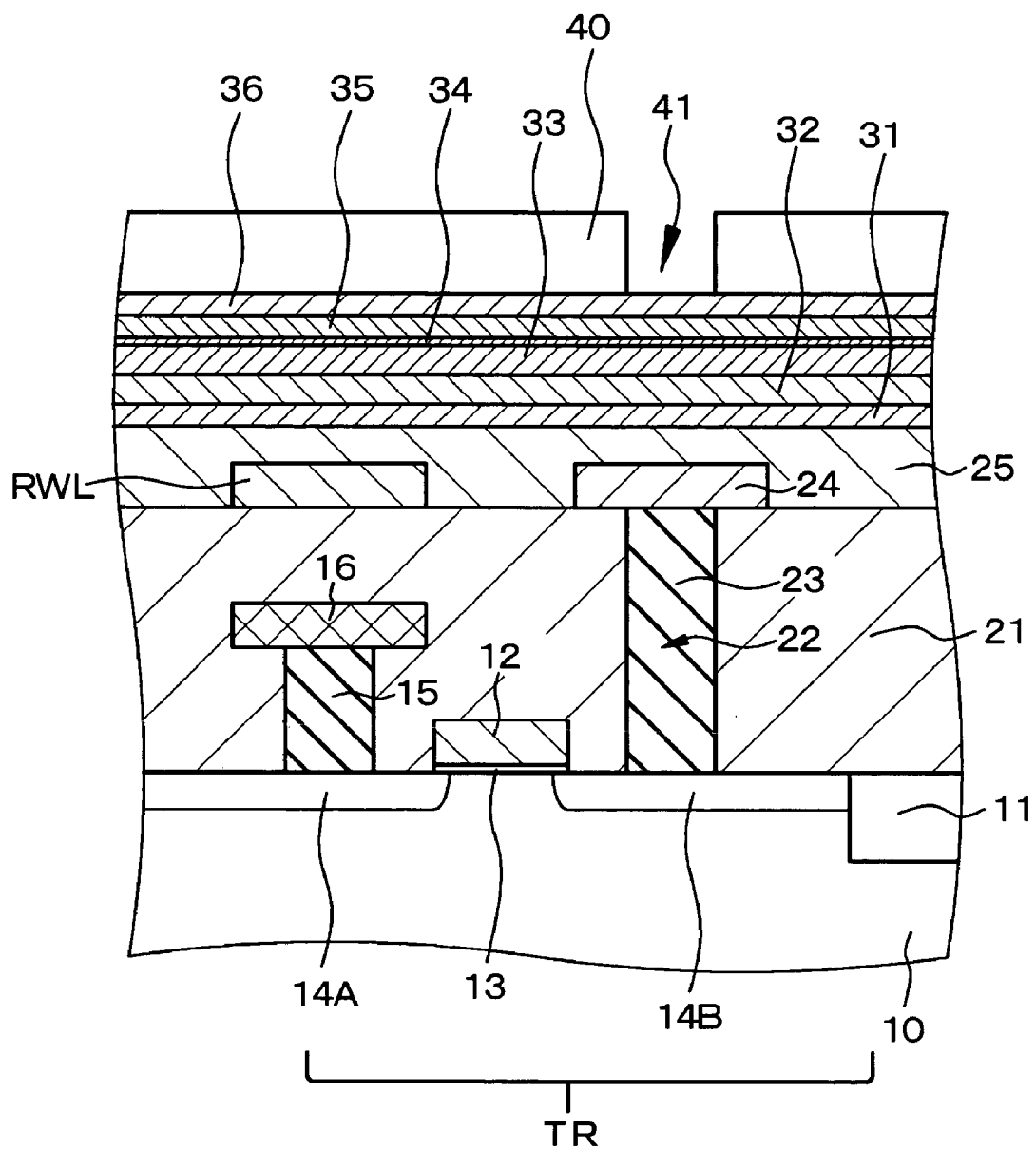
FIG. 3, following
Figure 4:
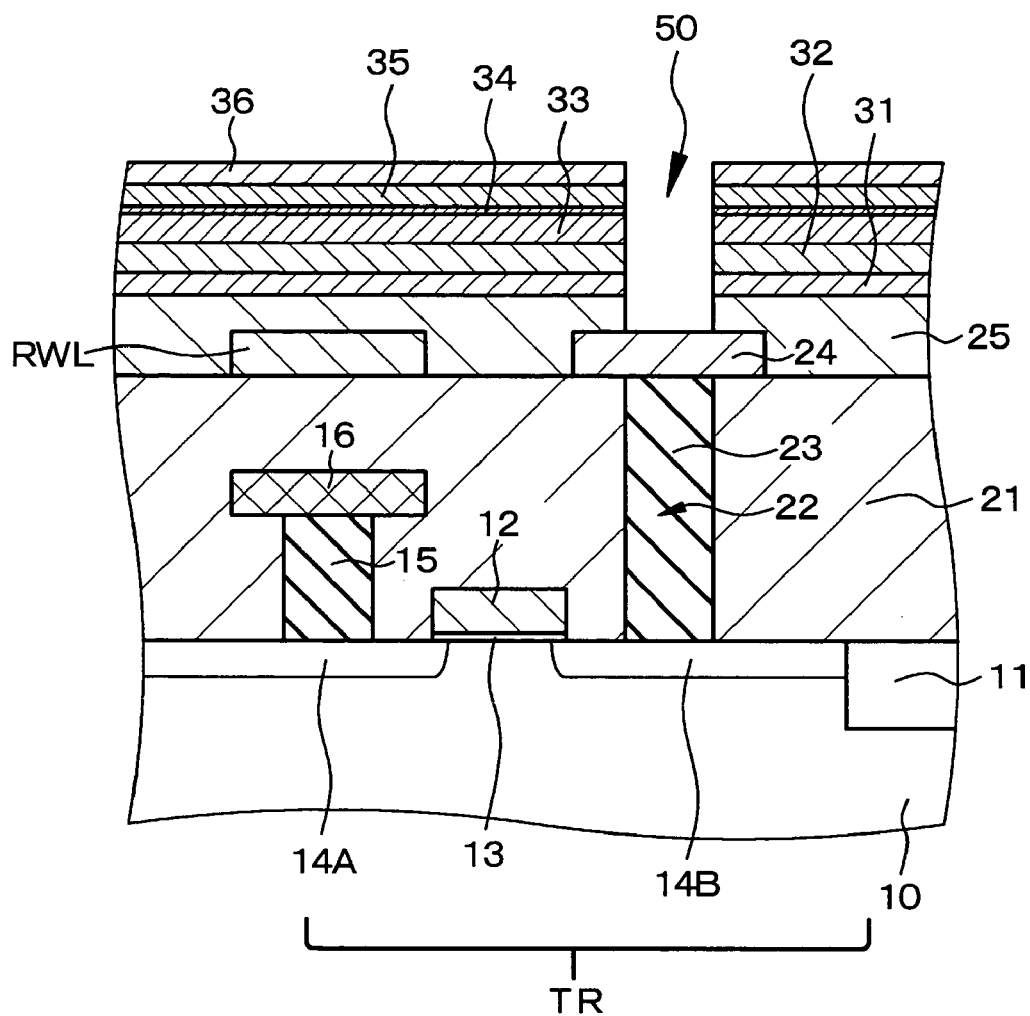
FIG. 4, following

A resist layer 40 having an opening 41 above the landing pad 24 is formed on the top coating film 36 by a lithography technique (see FIG. 3). Then, the second opening portion 50 is formed through those portions of the stacking structure (stacking structure including the barrier layer 31 up to the top coating film 36) and the second insulating interlayer 25 which portions are positioned above the first connecting hole 23, by an RIE method, and the resist layer 40 is removed by an ashing technique. In this manner, a structure shown in FIG. 4 can be obtained. Then, the landing pad 24 exposed in the bottom of the second opening portion 50 is argon-sputtered as required.

[Step-135]

Figure 5:
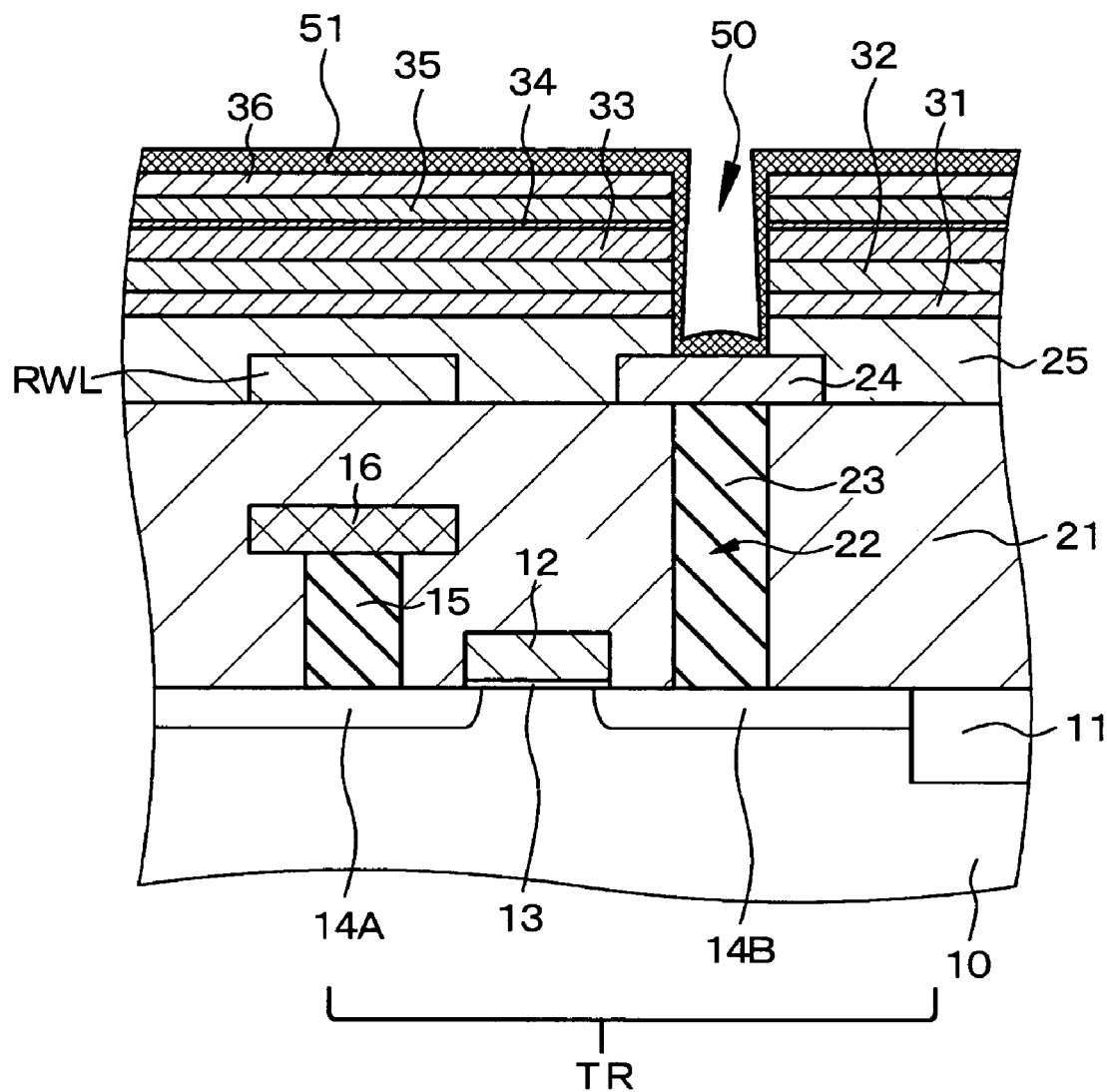
FIG. 5, following
Figure 6:
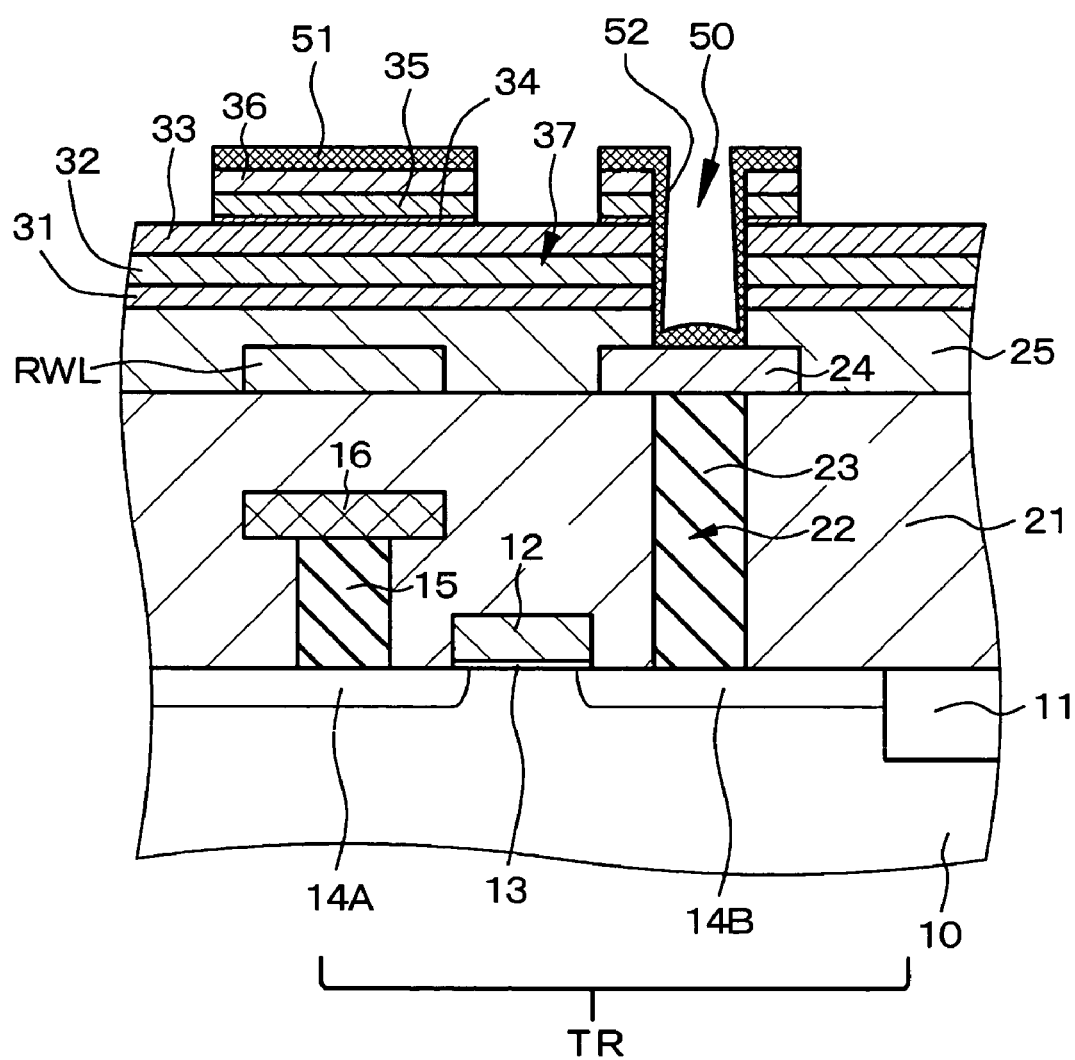
FIG. 6, following
Figure 7:
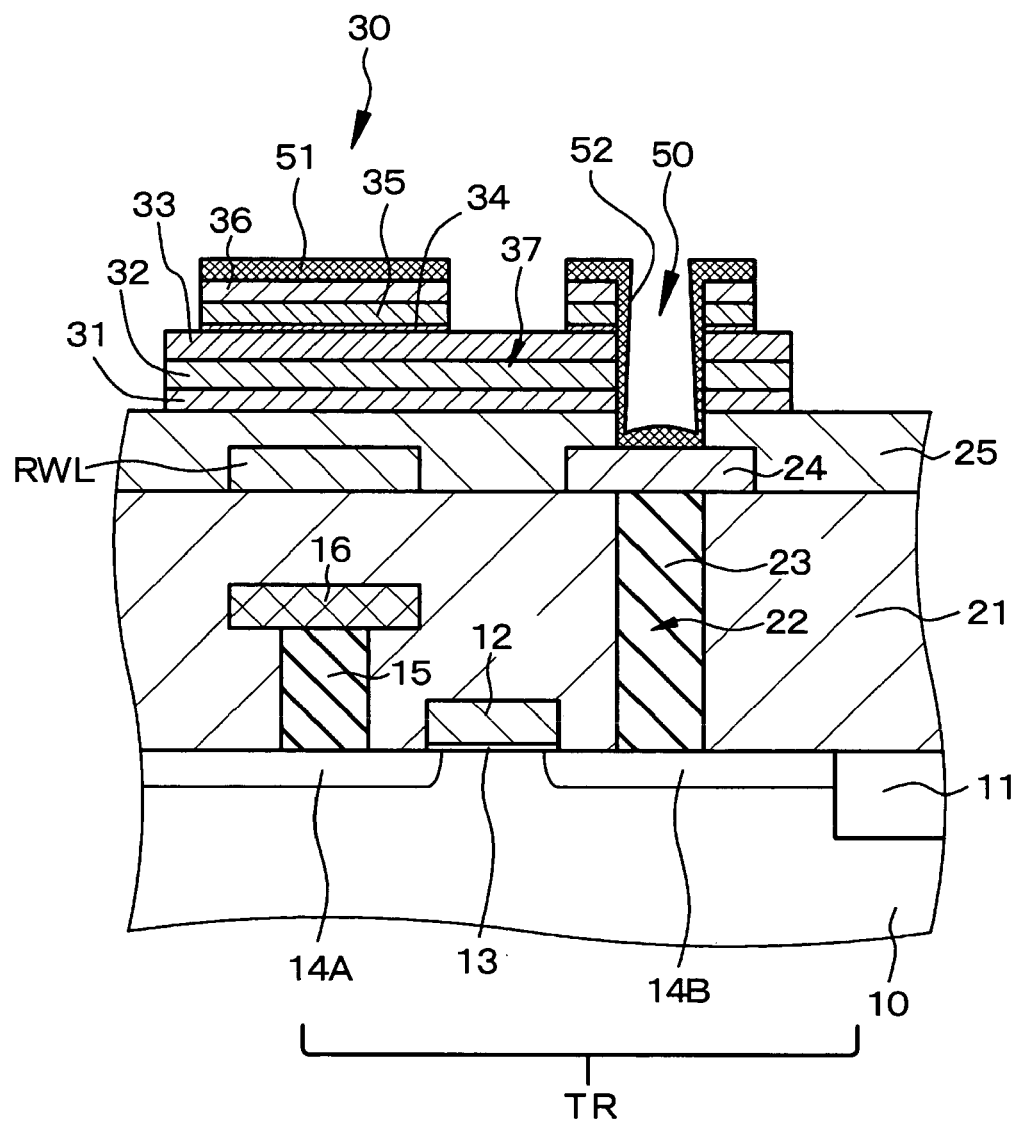
FIG. 7, following

Then, a 50 nm thick electrically conductive layer 51 made of Ta is formed on the entire surface including an inside of the second opening portion 50 by a sputtering method (see FIG. 5). The electrically conductive layer 51 may be formed, for example, by a CVD method.

[Step-140]

Then, the electrically conductive layer 51, the top coating film 36, the second ferromagnetic layer (memory layer) 35 and the tunnel barrier 34 are patterned according to a lithography technique and an RIE method. In this manner, there can be obtained the second connecting hole 52 connected to the first connecting hole 23 (more specifically, the landing pad 24) in the second opening portion 50 (see FIG. 6). The RIE condition is determined so that the end point of the etching is in the tunnel barrier 34. The etching gas can be selected from halogen mixture gases such as $Cl_2$ and $BCl_3$ or a gas mixture prepared by adding $NH_3$ to CO. Importantly, the etching condition is determined such that the etching selectivity of the second ferromagnetic layer (memory layer) 35 and the tunnel barrier 34 is 10 or more (etching rate of the second ferromagnetic layer 35/etching rate of the tunnel barrier 34=10/1 or more) or that the etching rate is decreased so as to terminate the etching in the thin tunnel barrier 34. When the pinned magnetic layer 33 is etched partly in the thickness direction, the plan form of the pinned magnetic layer 33 varies, and as a result, there may be caused fluctuation in the properties of the tunnel magnetoresistance device 30.

[Step-145]

Then, the first ferromagnetic layer (the pinned magnetic layer 33 and the anti-ferromagnetic layer 32) and the barrier layer 31 are patterned, whereby the tunnel magnetoresistance device 30 having the tunnel barrier 34 sandwiched between the first and second ferromagnetic layers 32, 33 and 35 can be obtained, and there can be as well obtained the extending portion 37 of the first ferromagnetic layer (extending portions of the pinned magnetic layer 33, the anti-ferromagnetic layer 32 and the barrier layer 31) which extending portion has an end face being in contact with the second connecting hole 52. In this manner, a structure shown in FIG. 7 can be obtained.

[Step-150]

Then, a 0.3 μm third insulating interlayer 26 made of $SiO_2$ is formed on the entire surface by a plasma CVD method, and then, the third insulating interlayer 26 is flattened by a CMP method.

[Step-155]

Then, an opening is formed through the third insulating interlayer 26 by lithography and etching techniques. The second wiring (bit line BL) is formed on the third insulating interlayer 26 including an inside of the above opening by a sputtering method, a lithography technique and an etching technique (see FIG. 8). The second wiring (bit line BL) is electrically connected to the second ferromagnetic layer (memory layer) 35 (more specifically, connected to the electrically conductive layer 51), and extends in the second direction (leftward and rightward on the drawing) crossing the first direction. In this case, wirings of peripheral circuits (not shown) and a bonding pad region (not shown) are also formed.

[Step-160]

Further, a silicon nitride film (not shown) is deposited on the entire surface by a plasma CVD method, and a bonding pad portion (not shown) is opened in the silicon nitride film to complete the manufacturing process of the MRAM.

In Example 1, when the resist layer 40 is removed in [Step-130], the second insulating interlayer 25 is covered with the stacking structure, so that the surface of the second insulating interlayer 25 is free from the formation of a convexoconcave shape. Further, when the landing pad 24 exposed in the bottom of the second opening portion 50 is argon-sputtered as required, the surface of the second insulating interlayer 25 is free from the formation of a convexoconcave shape. Further, the second connecting hole 52 is formed in [Step-135] and [Step-140], so that the second connecting hole 52 obtained is highly reliable.

EXAMPLE 2

Example 2 is a variant of the manufacturing method of an MRAM in Example 1. In Example 2, not only the electrically conductive layer 51, the top coating film 36, the second ferromagnetic layer (memory layer) 35 and the tunnel barrier 34 are patterned, but also the pinned magnetic layer 33 is patterned, in a step similar to [Step-140] in Example 1. And, while the first ferromagnetic layer is patterned in a step similar to [Step-145], specifically, the anti-ferromagnetic layer 32 is patterned. In this manner, there can be obtained the extending portion 37 of the first ferromagnetic layer (more specifically, the extending portion of the anti-ferromagnetic layer 32) which extending portion has an end face being in contact with the second connecting hole 52.

Figure 9:
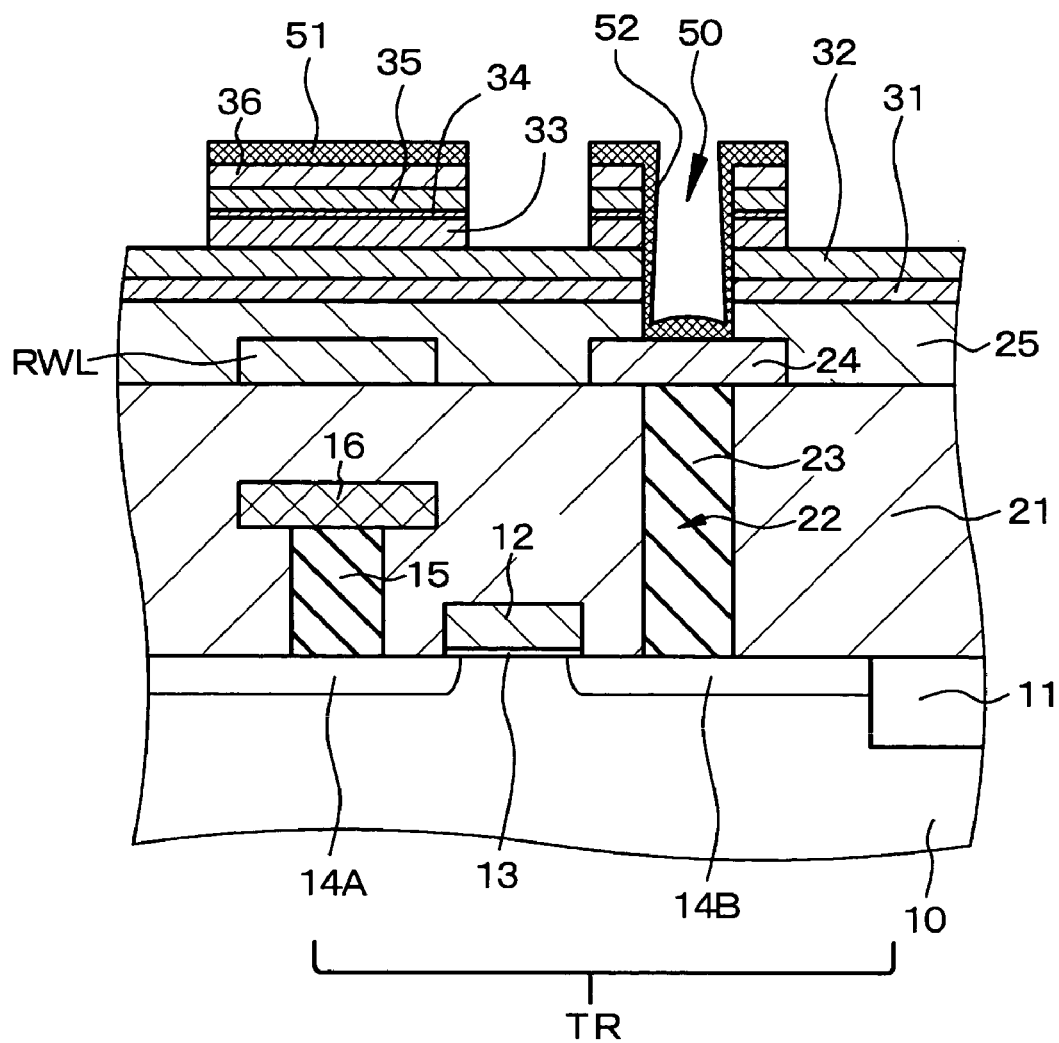
FIG. 9 is a schematic partial cross-sectional view of a semiconductor substrate, etc., for explaining a manufacturing method of an MRAM type nonvolatile magnetic memory device in Example 2.
Figure 10:
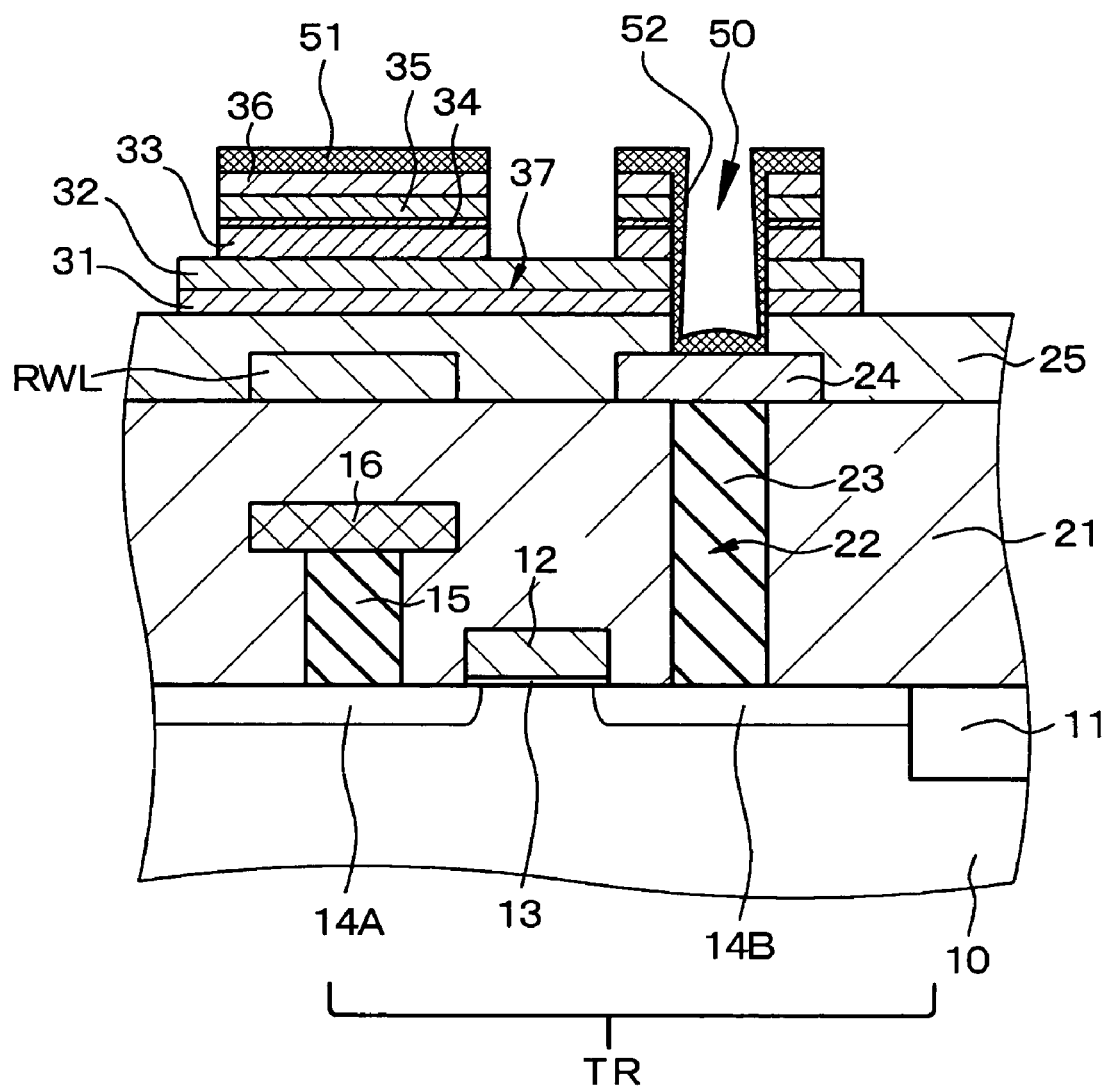
FIG. 10, following
Figure 11:
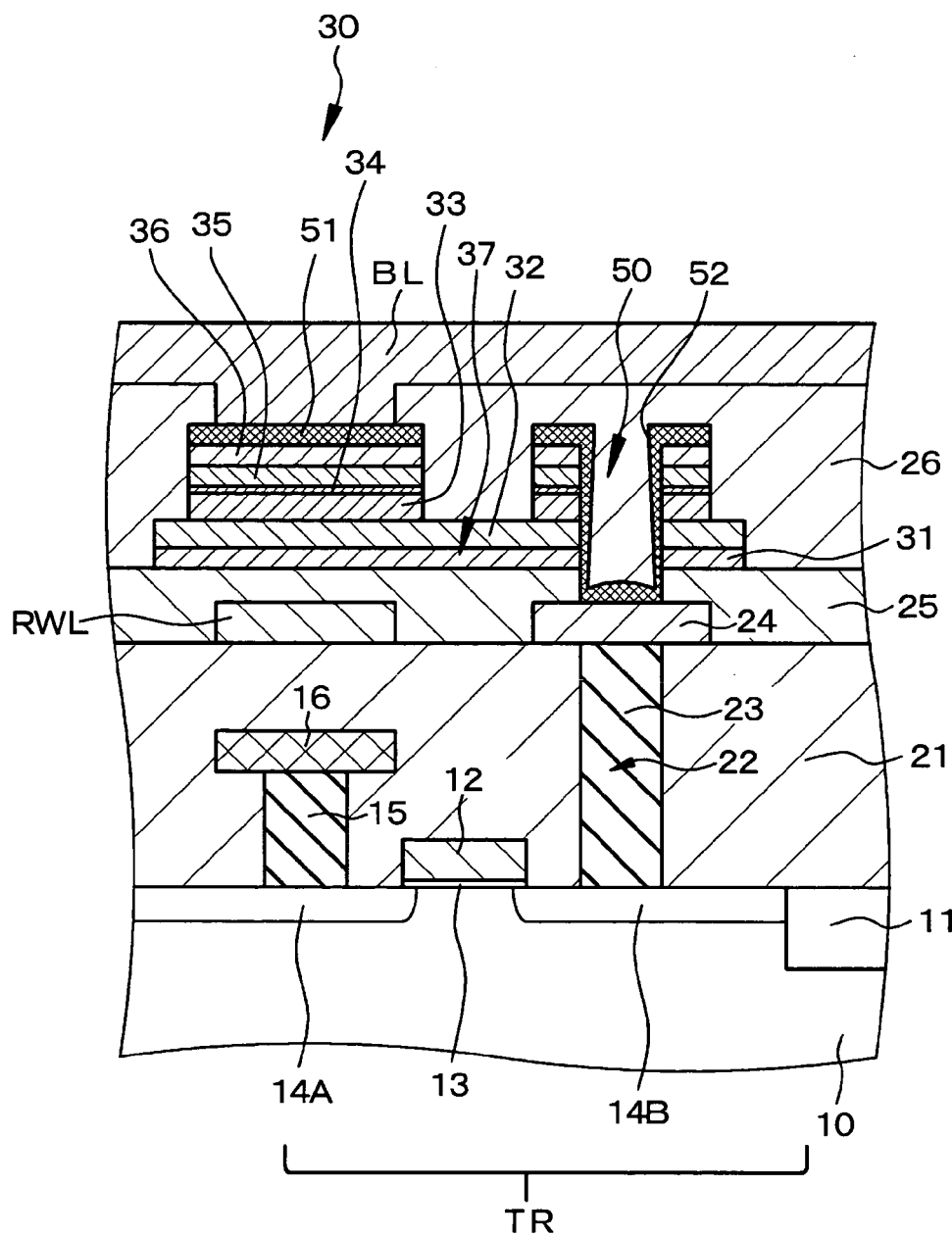
FIG. 11, following
Figure 12:
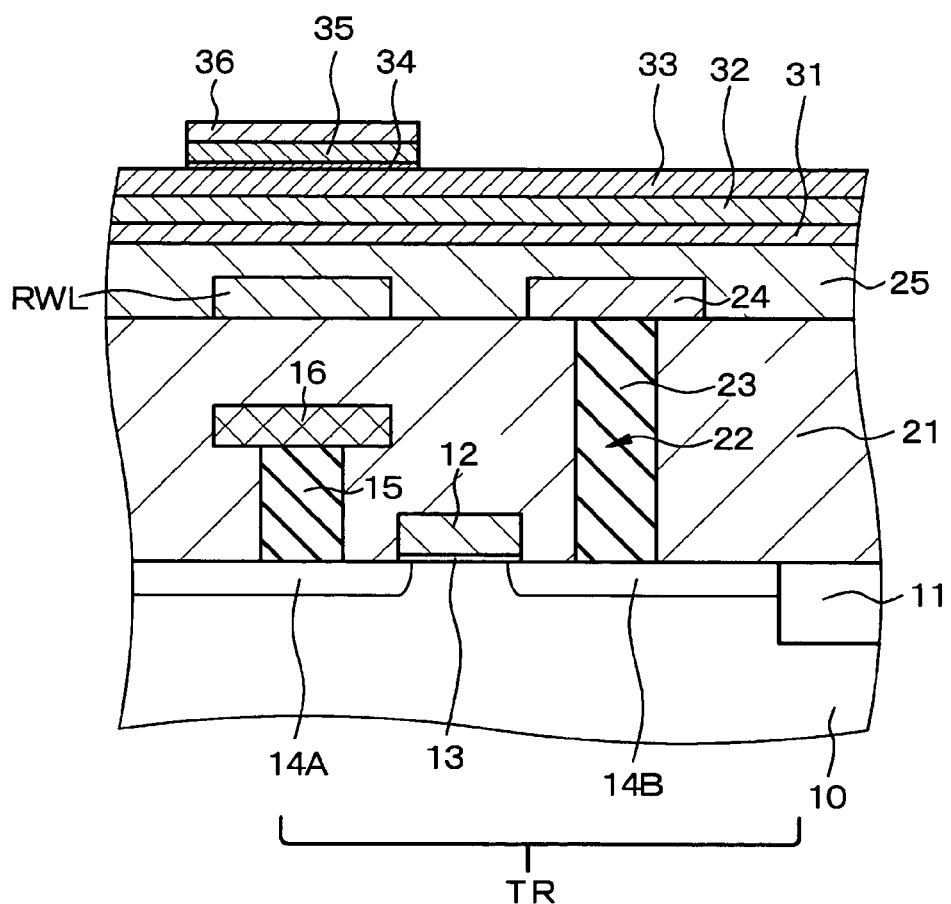
FIG. 12 is a schematic partial cross-sectional view of a semiconductor substrate, etc., for explaining a manufacturing method of an MRAM type nonvolatile magnetic memory device in Example 3.
Figure 13:
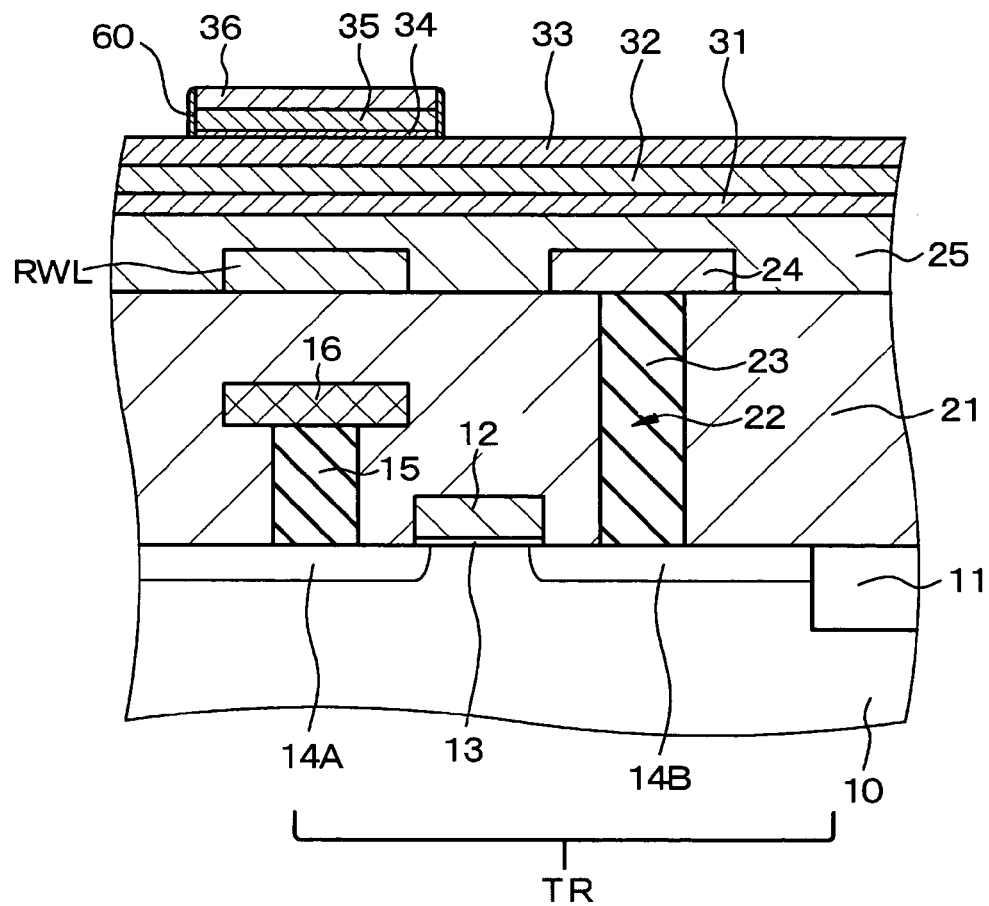
FIG. 13, following
Figure 14:
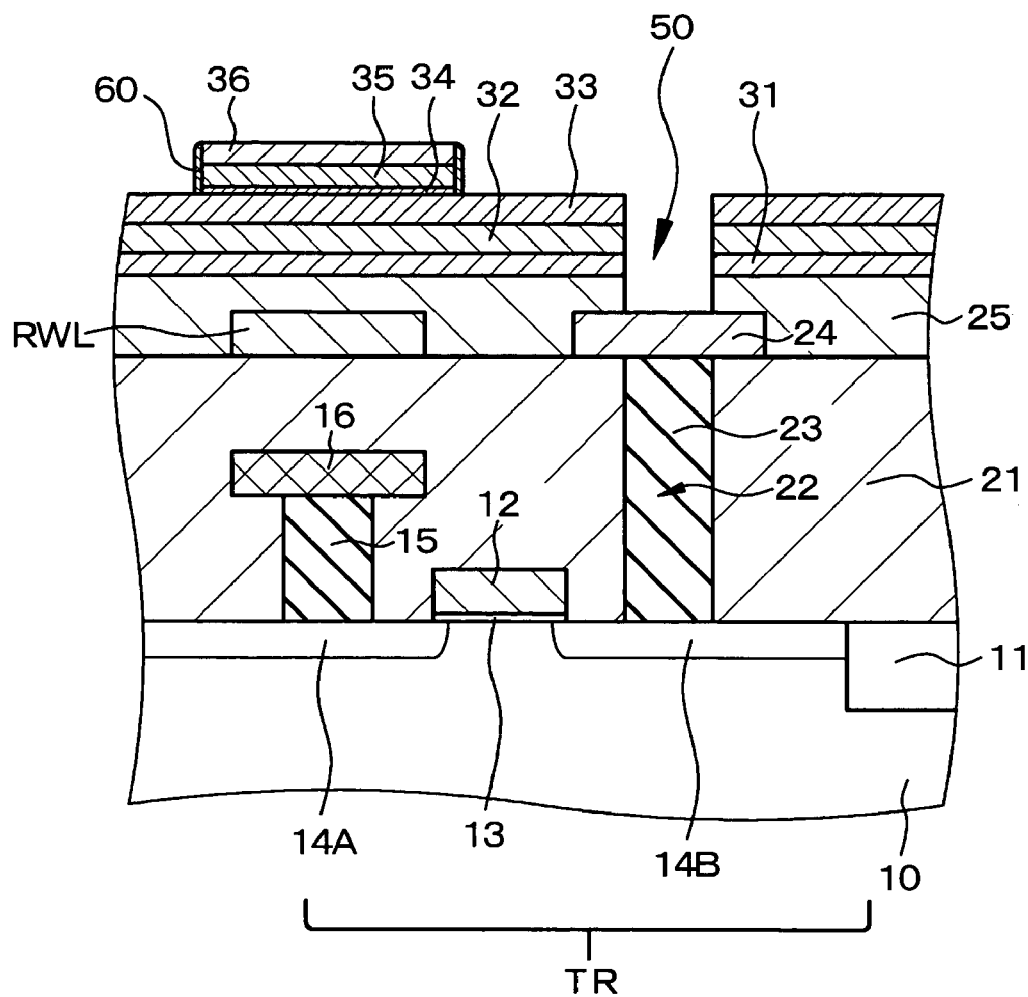
FIG. 14, following
Figure 15:
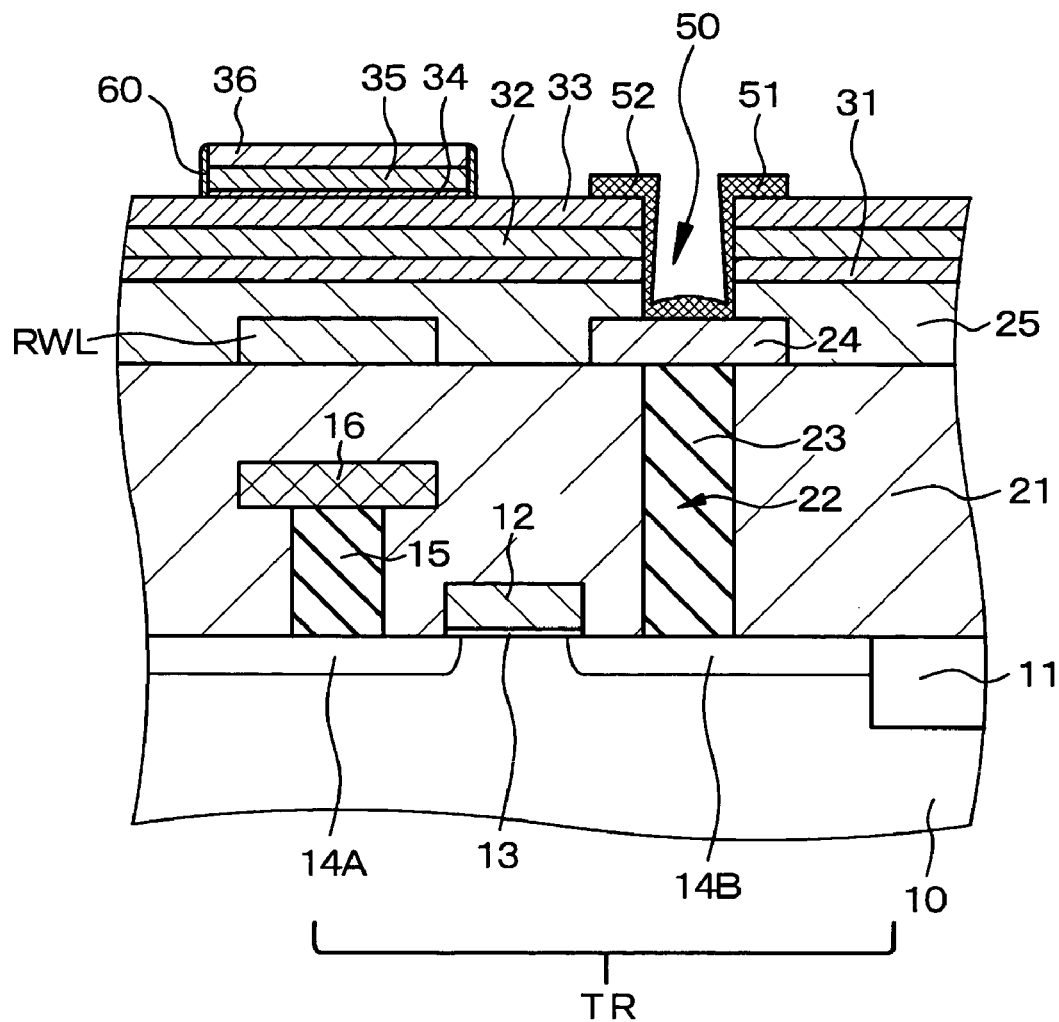
FIG. 15, following
Figure 16:
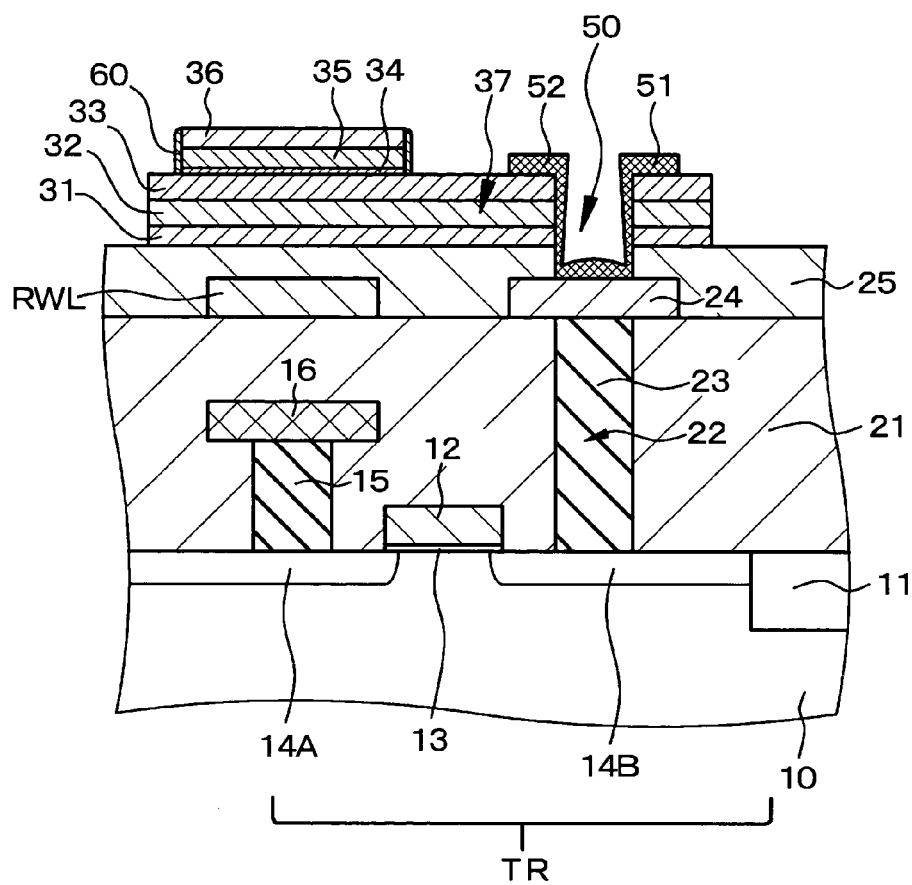
FIG. 16, following

The manufacturing method of an MRAM in Example 2 will be explained below with reference to FIGS. 9 to 11 that are schematic partial cross-sectional views of a semiconductor substrate 10 and the like.

[Step-200]

First, steps similar to [Step-100] to [Step-135] in Example 1 are carried out.

[Step-205]

Then, in a step similar to [Step-140] in Example 1, the pinned magnetic layer 33 is patterned in addition to the electrically conductive layer 51, the top coating film 36, the second ferromagnetic layer (memory layer) 35 and the tunnel barrier 34. In this manner, a structure shown in FIG. 9 can be obtained. Importantly, the pinned magnetic layer 33 is over-etched to some extent so that the pinned magnetic layer 33 is not locally present on the exposed surface of the anti-ferromagnetic layer 32. When the pinned magnetic layer 33 is locally present on the exposed surface of the anti-ferromagnetic layer 32, there may be caused fluctuation in the properties of the tunnel magnetoresistance device 30.

[Step-210]

Then, in a step similar to [Step-145] in Example 1, the anti-ferromagnetic layer 32 for constituting the first ferromagnetic layer and, further, the barrier layer 31 are patterned. In this manner, there can be obtained the extending portion 37 of the first ferromagnetic layer (specifically, extending portions of the anti-ferromagnetic layer 32 and the barrier layer 31) which extending portion has an end face being in contact with the second connecting hole 52 (see FIG. 10).

[Step-215]

Then, steps similar to [Step-150] to [Step-160] in Example 1 are carried out, to complete the MRAM. FIG. 11 shows structure obtained upon completion of the step similar to [Step-155].

EXAMPLE 3

Figure 17:
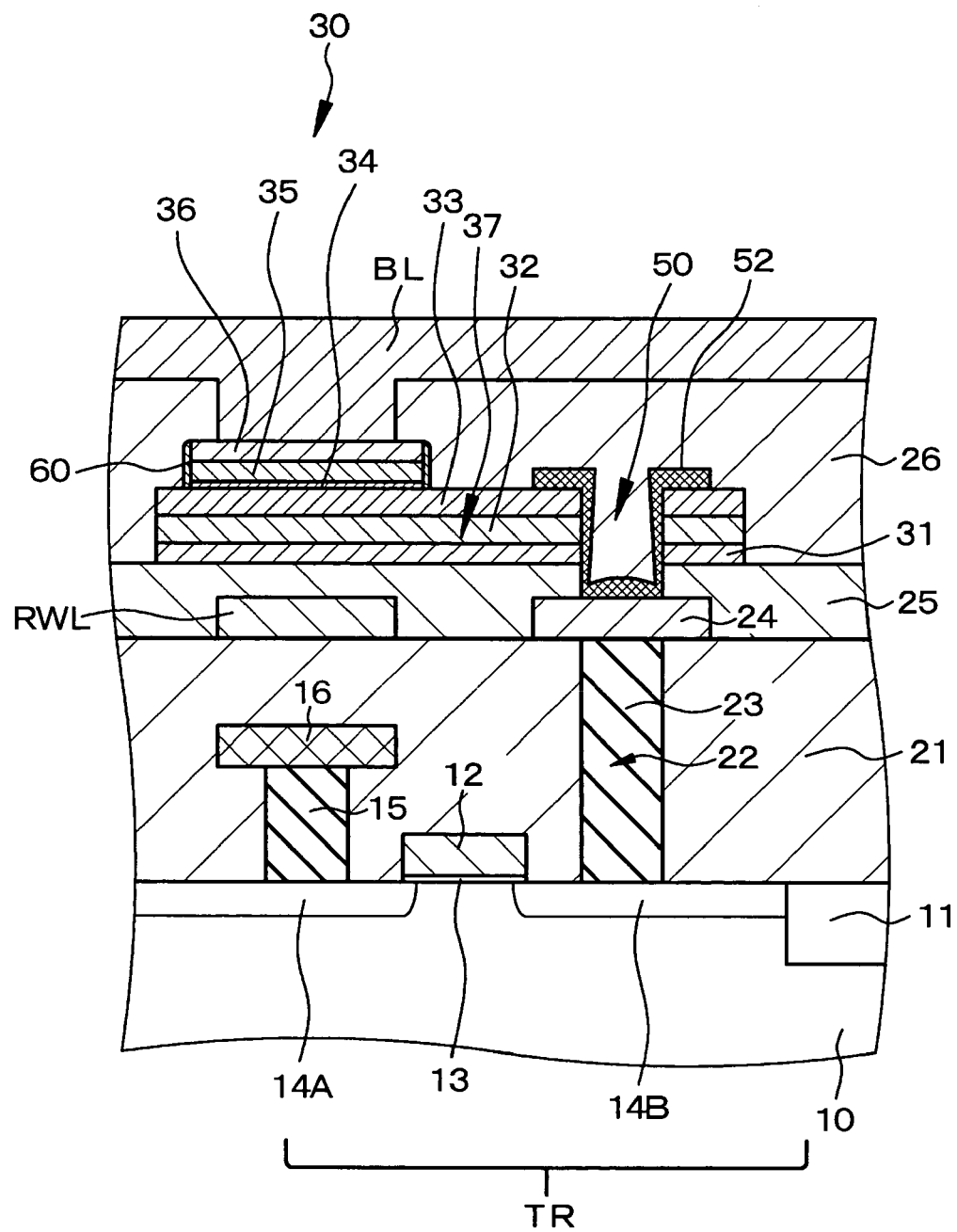
FIG. 17, following
Figure 18:
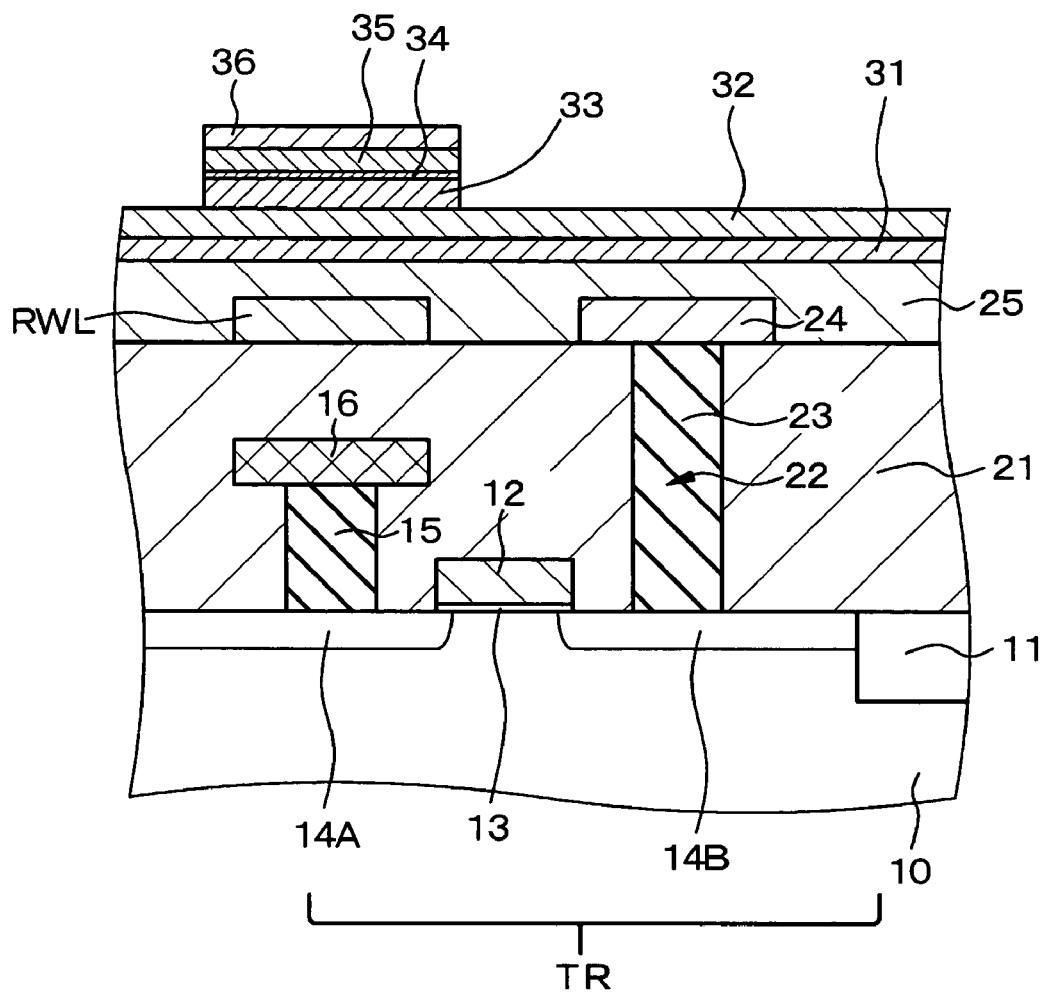
FIG. 18 is a schematic partial cross-sectional view of a semiconductor substrate, etc., for explaining a manufacturing method of an MRAM type nonvolatile magnetic memory device in Example 4.

Example 3 is concerned with the MRAM of the present invention and the manufacturing method of an MRAM according to the second aspect of the present invention. FIG. 17 shows a schematic partial cross-sectional view of the TMR-type MRAM in Example 3. The MRAM in Example 3 has substantially the same structure as that of the MRAM explained in Example 1 except that a sidewall 60 is formed on the side surfaces of the top coating film 36, the second ferromagnetic layer (memory layer) 35 and the tunnel barrier 34 and that the top portion of the second connecting hole 52 is formed on the pinned magnetic layer 33.

The manufacturing method of an MRAM in Example 3 will be explained below with reference to FIGS. 12 to 17 that are schematic partial cross-sectional views of a semiconductor substrate 10 and the like.

[Step-300]

The following steps are substantially the same as [Step-100] to [Step-125]. Therefore, detailed explanations of these steps will be omitted.

the step of forming a transistor for selection TR in the semiconductor substrate 10.

the step of forming a first insulating interlayer 21 on the entire surface.

the step of forming a first opening portion 22 through the first insulating interlayer 21, and forming a first connecting hole 23 connected to the transistor for selection TR in the first opening portion 22.

the step of forming a first wiring (write-in word line RWL) on the first insulating interlayer 21, said first wiring extending in a first direction.

the step of forming a second insulating interlayer 25 on the entire surface.

the step of forming a stacking structure constituted at least of a first ferromagnetic layer 32 and 33, a tunnel barrier 34 and a second ferromagnetic layer (memory layer) 35 on the second insulating interlayer 25.

[Step-305]

Then, a resist layer (not shown) is formed on the top coating film 36 by a lithography technique, and then, the top coating film 36, the second ferromagnetic layer (memory layer) 35 and the tunnel barrier 34 are patterned, followed by removal of the resist layer by an ashing technique. In this manner, a structure shown in FIG. 12 can be obtained. The RIE condition is determined such that the end point of the etching is in the tunnel barrier 34. The etching gas can be selected from halogen mixture gases such as $Cl_2$ and $BCl_3$ or a gas mixture prepared by adding $NH_3$ to CO. Importantly, the etching condition is determined such that the etching selectivity of the second ferromagnetic layer (memory layer) 35 and the tunnel barrier 34 is 10 or more (etching rate of the second ferromagnetic layer 35/etching rate of the tunnel barrier 34=10/1 or more) or that the etching rate is decreased so as to terminate the etching in the thin tunnel barrier 34. When the pinned magnetic layer 33 is etched partly in the thickness direction, the plan form of the pinned magnetic layer 33 varies, and as a result, there may be caused fluctuation in the properties, of the tunnel magnetoresistance device 30.

[Step-310]

Then, for example, an SiN film is formed on the entire surface, and the SiN film is etched back to form a sidewall 60 on the side surfaces of the top coating film 36, the second ferromagnetic layer (memory layer) 35 and the tunnel barrier 34. When an electrically conductive layer 51 is formed on a step to come later, the formed sidewall 60 can reliably prevent short-circuiting of above layers with the electrically conductive layer 51.

[Step-315]

Then, a second opening portion 50 is formed through those portions of the first ferromagnetic layer (the pinned magnetic layer 33 and the anti-ferromagnetic layer 32) and the second insulating interlayer 25 which portions are positioned above the first connecting hole 23 (specifically, above the landing pad 24). Specifically, a resist layer (not shown) having an opening above the landing pad 24 is formed on the entire surface by a lithography technique. Then, the second opening portion 50 is formed through those portions of the first ferromagnetic layer (the pinned magnetic layer 33 and the anti-ferromagnetic layer 32), the barrier layer 31 and the second insulating interlayer 25 which portions are positioned above the first connecting hole 23, by an RIE method, and then, the resist layer is removed by an ashing technique. In this manner, a structure shown in FIG. 14 can be obtained. Then, the landing pad 24 exposed in the bottom of the second opening portion 50 is argon-sputtered as required.

[Step-320]

The 50 nm thick electrically conductive layer 51 made of Ta is formed on the entire surface including an inside of the second opening portion 50 (more specifically, on the pinned magnetic layer 33 including the inside of the second opening portion 50) by a sputtering method. The electrically conductive layer 51 may be also formed, for example, by a CVD method.

[Step-325]

Then, the electrically conductive layer 51 is patterned by a lithography technique and an etching technique. In this manner, there can be formed a second connecting hole 52 connected to the first connecting hole 23 (more specifically, being in contact with the landing pad 24) in the second opening portion 50 (see FIG. 15).

[Step-330]

Then, the first ferromagnetic layer (the pinned magnetic layer 33 and the anti-ferromagnetic layer 32) and the barrier layer 31 are patterned, whereby there can be obtained the tunnel magnetoresistance device 30 having the tunnel barrier 34 sandwiched between the first and second ferromagnetic layers 32, 33 and 35, and there can be also obtained the extending portions 37 of the first ferromagnetic layer (the pinned magnetic layer 33 and the anti-ferromagnetic layer 32) and the barrier layer 31 which extending portions have an end face being in contact with the second connecting hole 52. In this manner, a structure shown in FIG. 16 can be obtained.

[Step-335]

Then, there are carried out the step of forming a third insulating interlayer 26 on the entire surface and the step of forming a second wiring (bit line BL) on the third insulating interlayer 26. The second wiring (bit line BL) is electrically connected to the second ferromagnetic layer (memory layer) 35 and extends in the second direction different from the first direction. Specifically, steps similar to [Step-150] to [Step-160] in Example 1 can be carried out. FIG. 17 shows a structure obtained upon completion of a step similar to [Step-155].

In Example 3 as well, when the resist layer is removed in [Step-315], the second insulating interlayer 25 is covered with the stacking structure, so that the surface of the second insulating interlayer 25 is free from the formation of a convexoconcave shape. Further, when the landing pad 24 exposed in the bottom of the second opening portion 50 is argon-sputtered as required, the surface of the second insulating interlayer 25 is free from the formation of a convexoconcave shape. Further, the second connecting hole 52 is formed in [Step-320] and [Step-325], so that the second connecting hole 52 obtained is highly reliable.

EXAMPLE 4

Example 4 is a variant of the manufacturing method of an MRAM in Example 3.

In Example 4, in a step similar to [Step-305] in Example 3, the pinned magnetic layer 33 is patterned in addition to the top coating film 36, the second ferromagnetic layer (memory layer) 35 and the tunnel barrier 34. And, in a step similar to [Step-315] in Example 3, the second opening portion 50 is formed through those portions of the anti-ferromagnetic layer 32 and the second insulating interlayer 25 which portions are positioned above the first connecting hole 23. Further, in a step similar to [Step-320] in Example 3, the electrically conductive layer 51 is formed on the anti-ferromagnetic layer 32 including the inside of the second opening portion 50, and in a step similar to [Step-325] in Example 3, the first ferromagnetic layer is patterned, and specifically, the anti-ferromagnetic layer 32 is patterned, whereby there can be obtained the extending portion 37 of the first ferromagnetic layer (more specifically, the extending portion of the anti-ferromagnetic layer 32) which extending portion has an end face being in contact with the second connecting hole 52. The MRAM in Example 4 differs from the MRAM in Example 3 in that the top portion of the second connecting hole 52 is formed on the anti-ferromagnetic layer 32.

The manufacturing method of an MRAM in Example 4 will be explained below with reference to FIGS. 18 to 23 that are schematic partial cross-sectional views of a semiconductor substrate 10 and the like.

[Step-400]

A step similar to [Step-300] in Example 3 is carried out.

[Step-405]

Then, in a step similar to [Step-305] in Example 3, the pinned magnetic layer 33 is patterned in addition to the top coating film 36, the second ferromagnetic layer (memory layer) 35 and the tunnel barrier 34. In this manner, a structure shown in FIG. 18 can be obtained. Importantly, the pinned magnetic layer 33 is over-etched to some extent so that the pinned magnetic layer 33 is not locally present in the exposed surface of the ferromagnetic layer 32. When the pinned magnetic layer 33 is locally present on the exposed surface of the anti-ferromagnetic layer 32, there may be caused fluctuation in the properties of the tunnel magnetoresistance device 30.

[Step-410]

Figure 19:
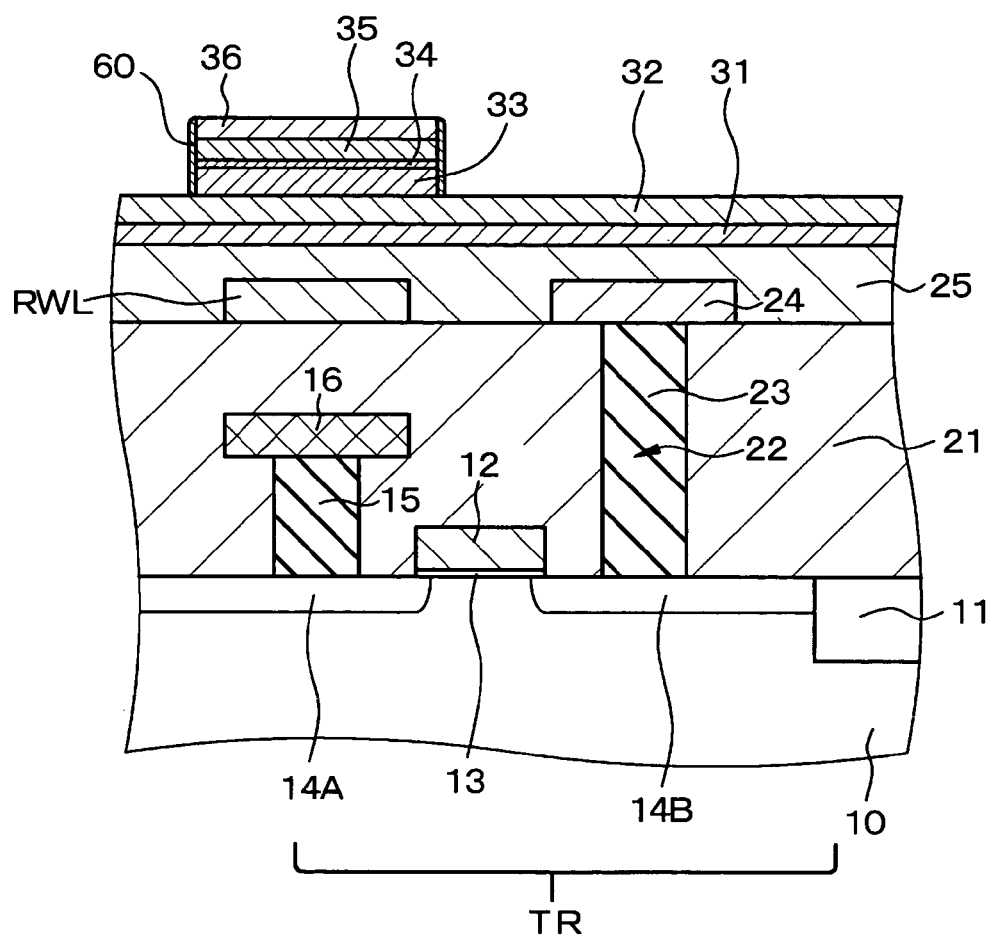
FIG. 19, following
Figure 20:
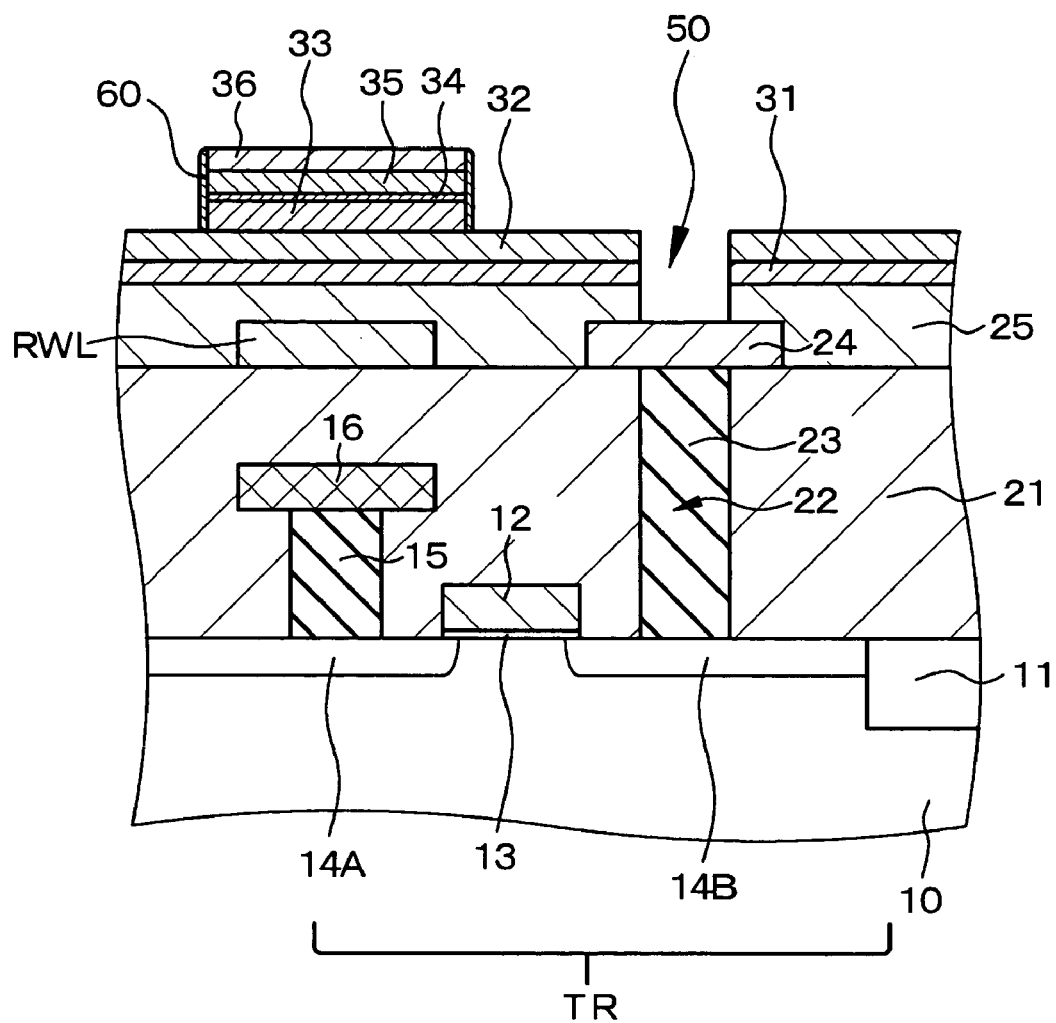
FIG. 20, following
Figure 21:
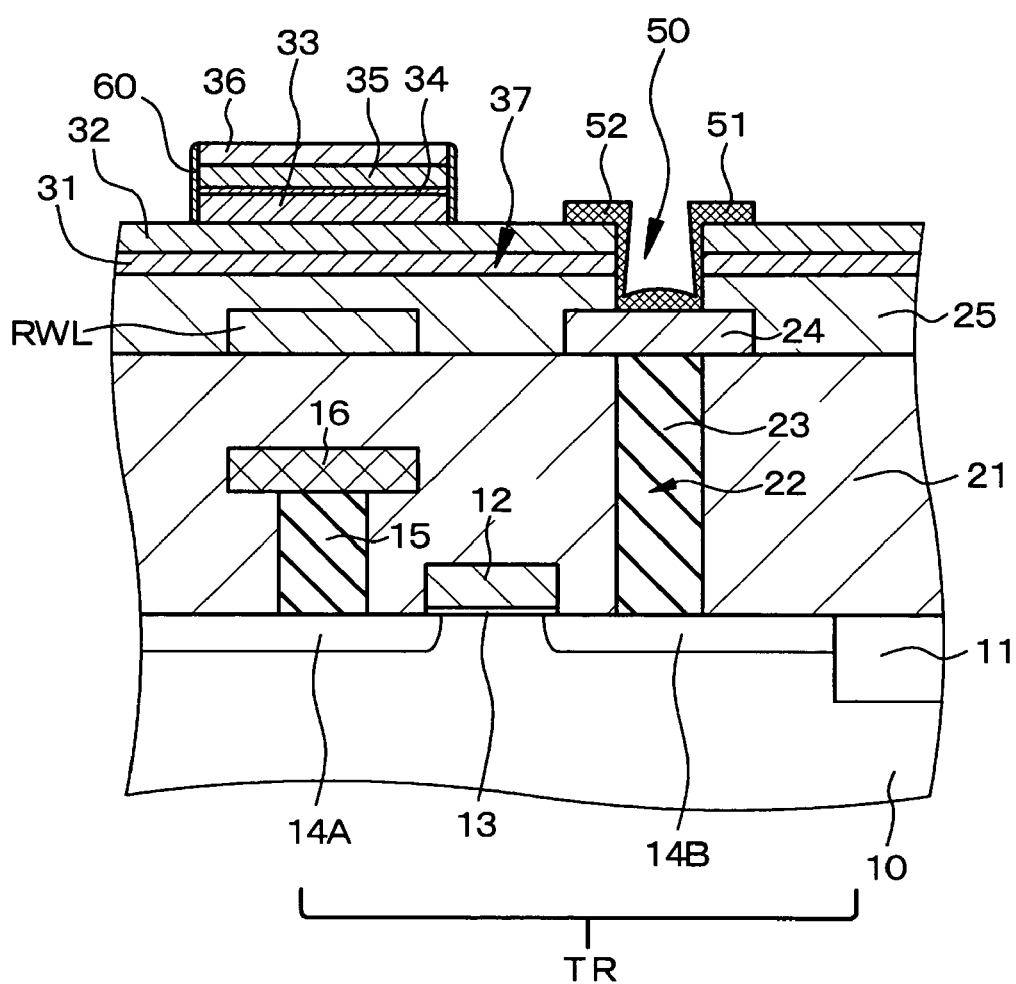
FIG. 21, following
Figure 22:
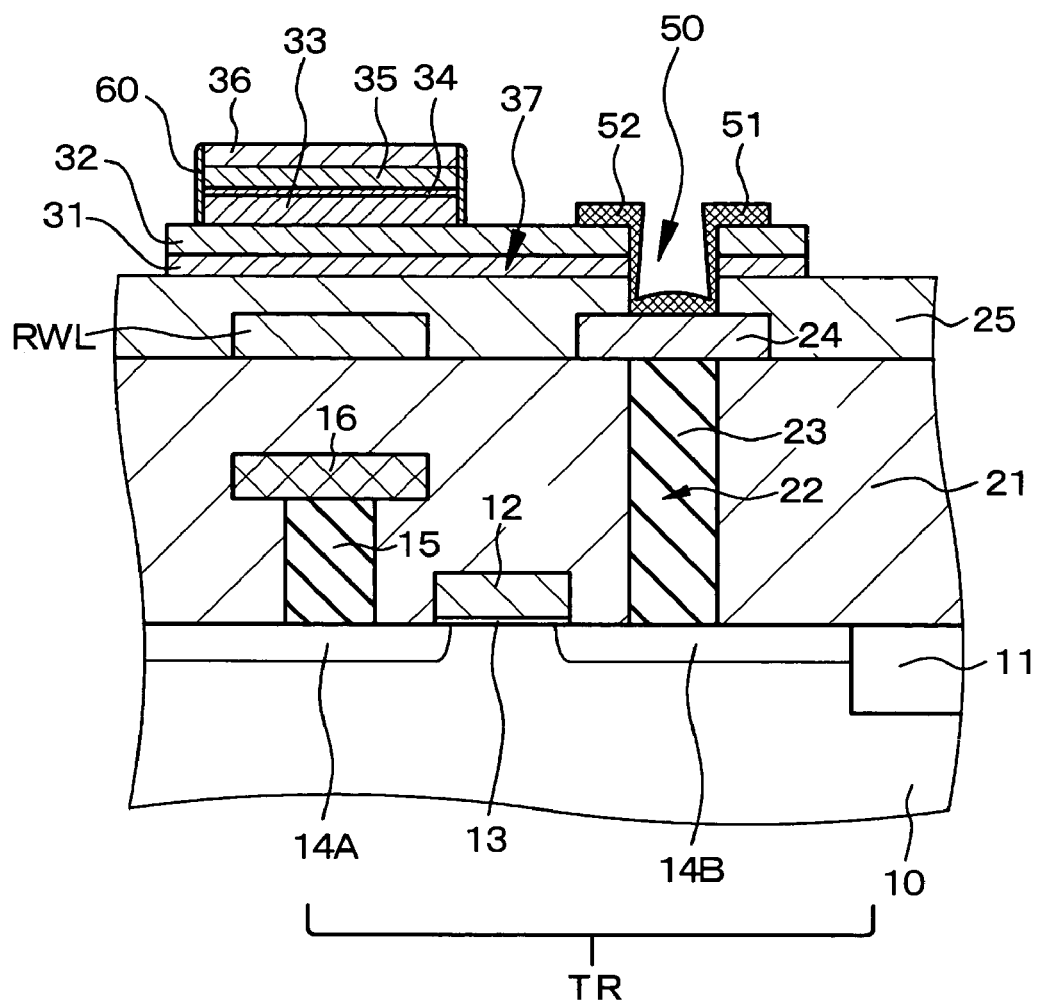
FIG. 22, following

Then, in a step similar to [Step-310] in Example 3, a sidewall 60 is formed on the side surfaces of the top coating film 36, the second ferromagnetic layer (memory layer) 35, the tunnel barrier 34 and the pinned magnetic layer 33 (see FIG. 19).

[Step-415]

Then, the second opening portion 50 is formed through those portions of the first ferromagnetic layer (more specifically, the anti-ferromagnetic layer 32) and the second insulating layer 25 which portions are positioned above the first connecting hole 23 (more specifically, the landing pad 24). Specifically, a resist layer (not shown) having an opening above the landing pad 24 is formed on the entire surface by a lithography technique. Then, the second opening portion 50 is formed through those portions of the first ferromagnetic layer (specifically, the anti-ferromagnetic layer 32), the barrier layer 31 and the second insulating Interlayer 25 which portions are positioned above the first connecting hole 23, by an RIE method, and then, the resist layer is removed by an ashing technique. In this manner, a structure shown in FIG. 20 can be obtained. Then, the landing pad 24 exposed in the bottom of the second opening portion 50 is argon-sputtered as required.

[Step-420]

Then, a 50 nm thick electrically conductive layer 51 made of Ta is formed on the entire surface including an inside of the second opening portion 50 (more specifically, on the anti-ferromagnetic layer 32 including the inside of the second opening portion 50) by a sputtering method. The electrically conductive layer 51 may be also formed, for example, by a CVD method.

[Step-425]

The electrically conductive layer 51 is patterned by a lithography technique and an etching technique. In this manner, the second connecting hole 52 connected to the first connecting hole 23 (more specifically, being in contact with the landing pad 24) can be formed in the second opening portion 50 (see FIG. 21).

[Step-430]

Then, the first ferromagnetic layer (specifically, the ferromagnetic layer 32) and, further, the barrier layer 31 are patterned, whereby there can be obtained the tunnel magnetoresistance device 30 having the tunnel barrier 34 sandwiched between the first and second ferromagnetic layers 32, 33 and 35, and there can be also obtained the extending portion 37 of the first ferromagnetic layer (specifically, the extending portions of the anti-ferromagnetic layer 32 and the barrier layer 31) which extending portion has an end face being in contact with the second connecting hole 52. In this manner, a structure shown in FIG. 22 can be obtained.

[Step-435]

Figure 23:
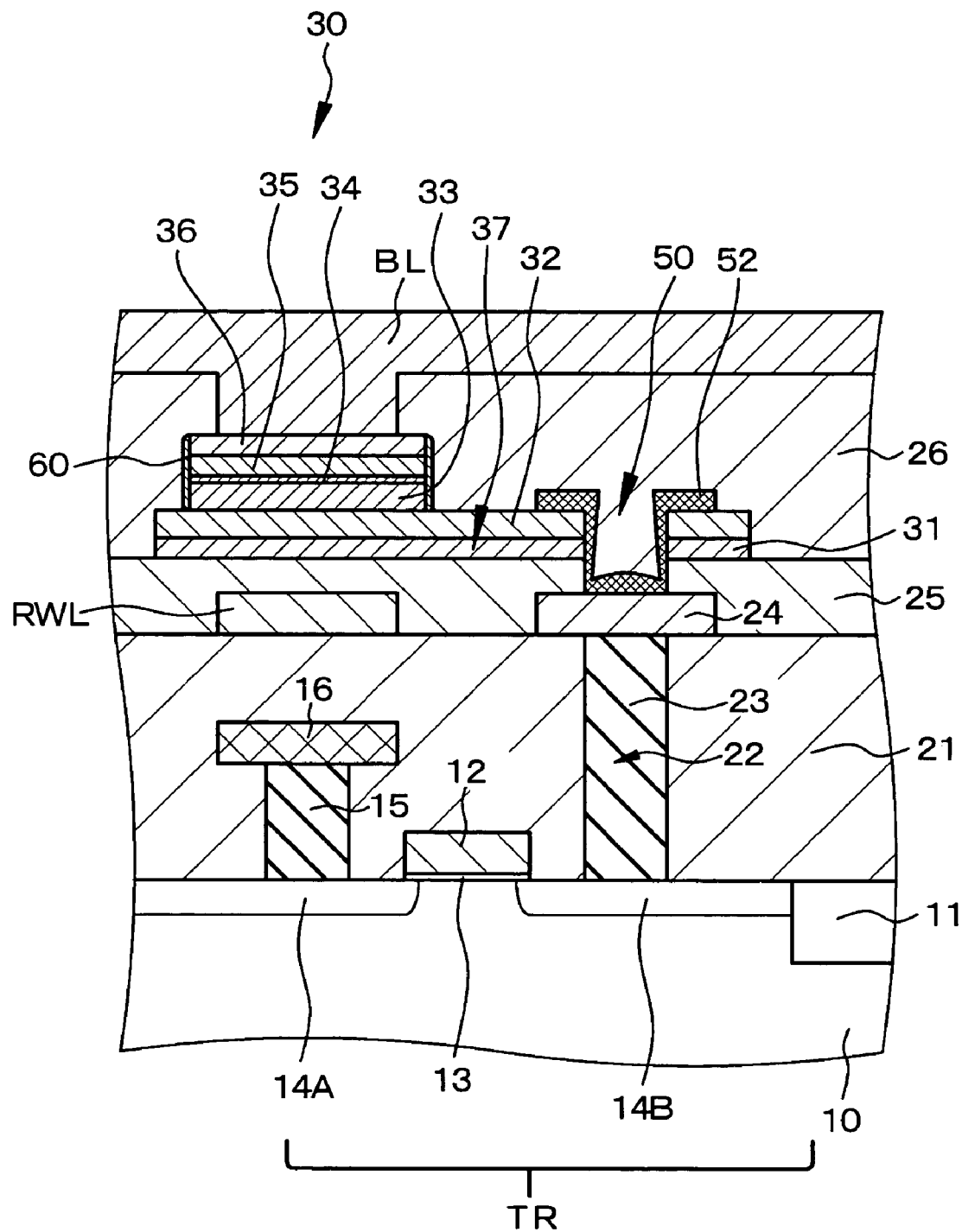
FIG. 23, following
Figure 24:
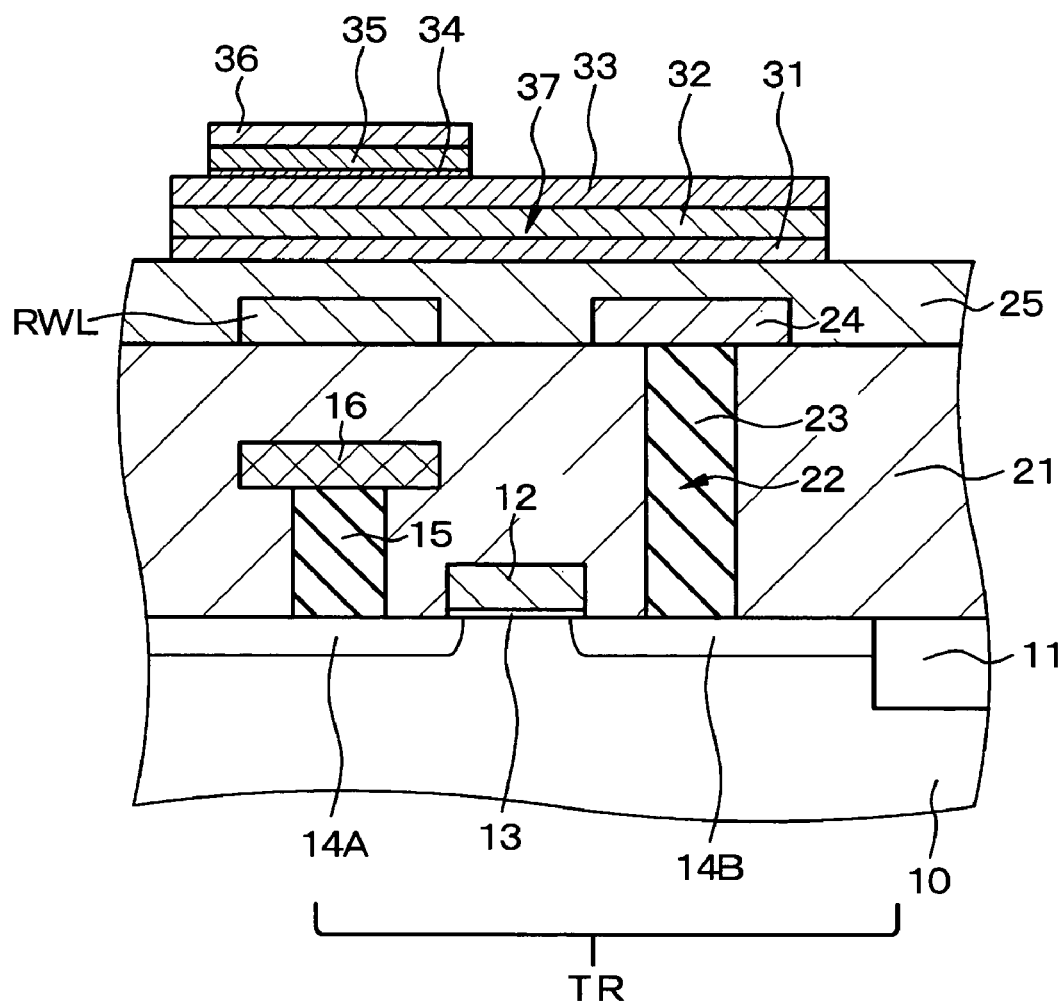
FIG. 24 is a schematic partial cross-sectional view of a semiconductor substrate, etc., for explaining a manufacturing method of an MRAM type nonvolatile magnetic memory device in Example 5.

Then, there are carried out the step of forming a third insulating interlayer 26 on the entire surface and the step of forming a second wiring (bit line BL) on the third insulating interlayer 26. The second wiring (bit line BL) is electrically connected to the second ferromagnetic layer (memory layer) 35 and extends in the second direction different from the first direction. Specifically, steps similar to [Step-150] to [Step-160] in Example 1 can be carried out. FIG. 23 shows a structure obtained upon completion of a step similar to [Step-155].

EXAMPLE 5

Example 5 is also a variant of the manufacturing method of an MRAM in Example 3 and is concerned with the manufacturing method of an MRAM according to the third aspect of the present invention.

Figure 28:
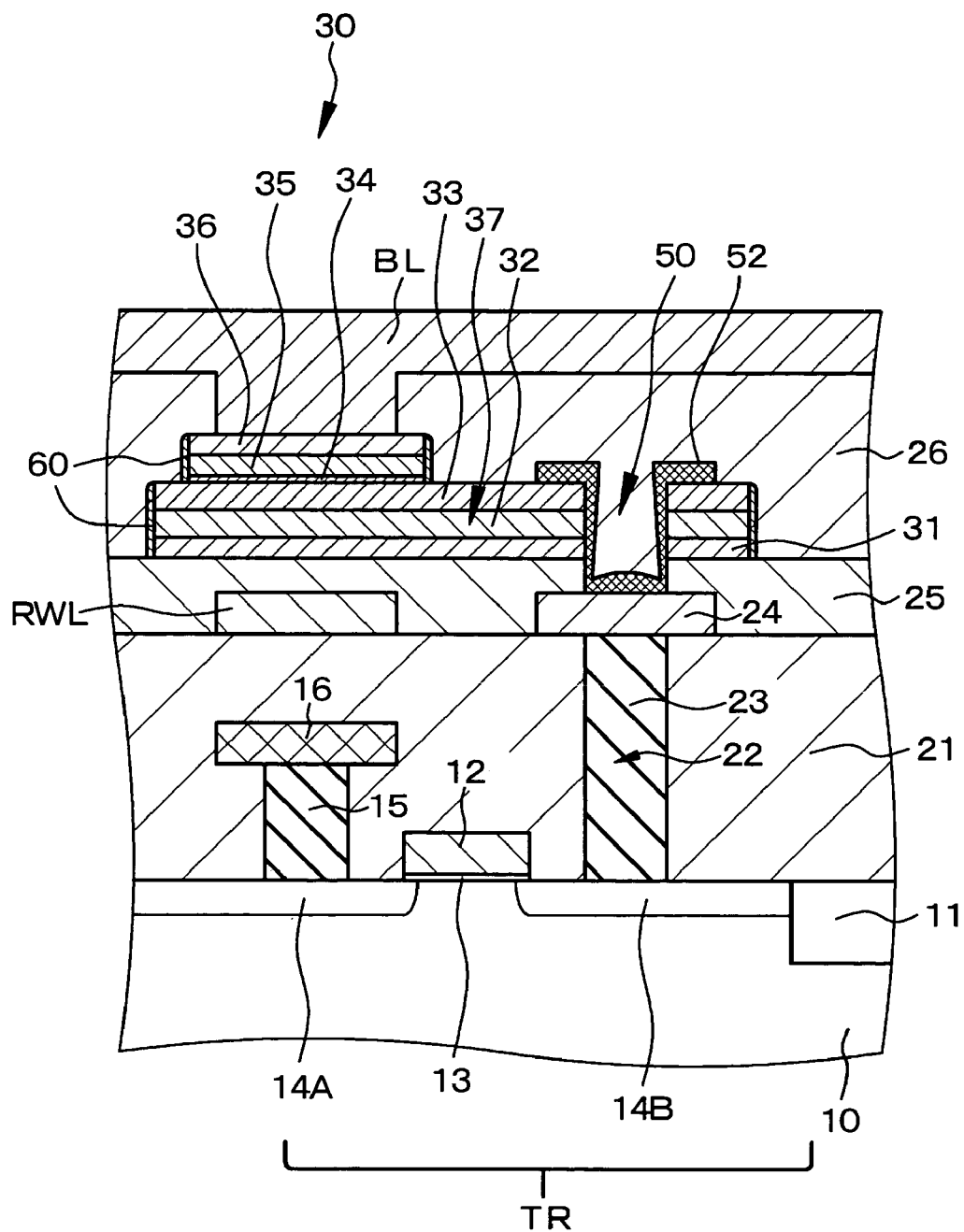
FIG. 28, following
Figure 29:
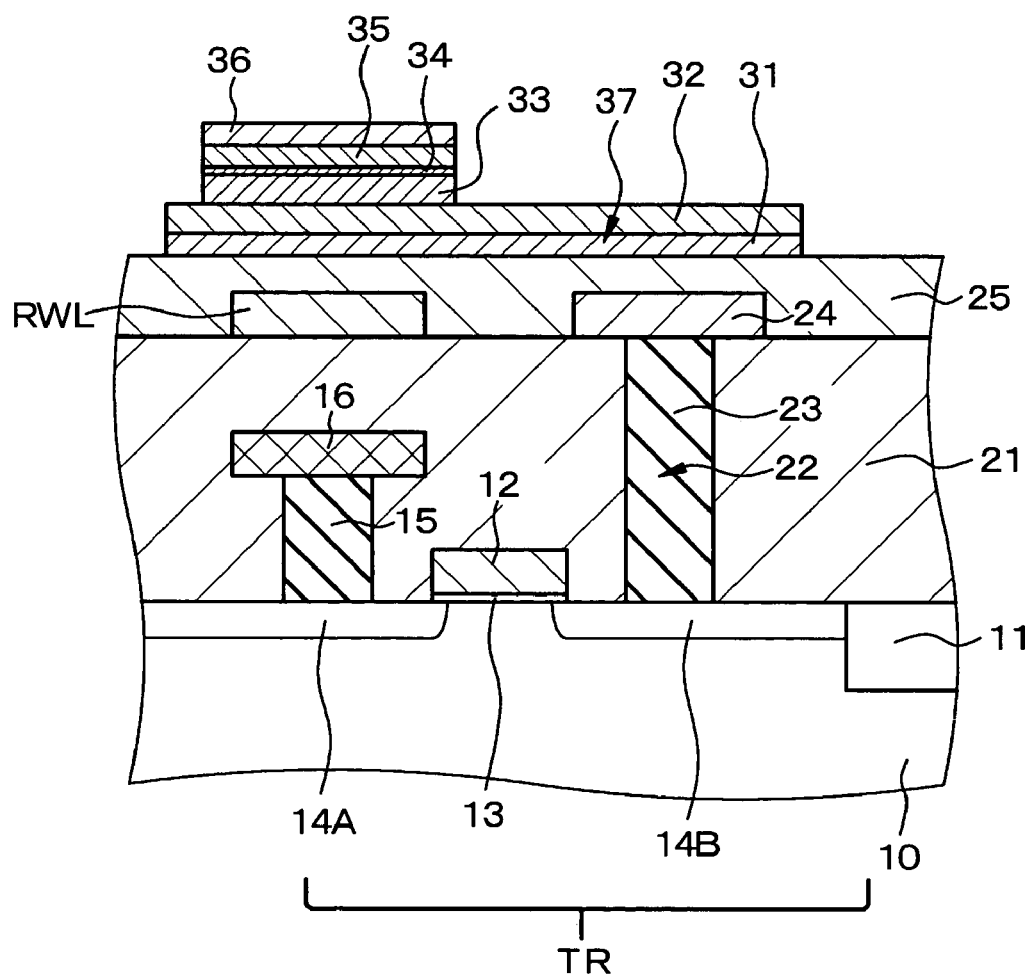
FIG. 29 is a schematic partial cross-sectional view of a semiconductor substrate, etc., for explaining a manufacturing method of an MRAM type nonvolatile magnetic memory device in Example 6.

FIG. 28 shows a schematic partial cross-sectional view of the TMR-type MRAM in Example 5, which has substantially the same structure as that of the MRAM explained in Example 1 except that a sidewall 60 is formed on the side surfaces of the top coating layer 36, the second ferromagnetic layer (memory layer) 35, the tunnel barrier 34, the pinned magnetic layer 33, the anti-ferromagnetic layer 32 and the barrier layer 31 and that the top portion of the second connecting hole 52 is formed on the pinned magnetic layer 33.

Example 5 includes a step which follows a step similar to [Step-305] in Example 3 and in which the first ferromagnetic layer is pattered to obtain the tunnel magnetoresistance device 30 having the tunnel barrier 34 sandwiched between the first and second ferromagnetic layers 32, 33 and 35 and also to obtain the extending portion 37 of the first ferromagnetic layer. Further, in a step similar to [Step-315] in Example 3, the second opening portion 50 is formed through those portions of the extending portion 37 of the first ferromagnetic layer and the second insulating interlayer 25 which portions are positioned above the first connecting hole 23, and a step similar to [Step-325] in Example 3 is followed by steps similar to [Step-335] and steps thereafter while a step similar to [Step-330] in Example 3 is omitted. In the manufacturing method of an MRAM in Example 5, there can be obtained the extending portion 37 of the first ferromagnetic layer (more specifically, the extending portions of the pinned magnetic layer 33 and the anti-ferromagnetic layer 32) which extending portion has an end face being in contact with the second connecting hole 52.

The manufacturing method of an MRAM in Example 5 will be explained below with reference to FIGS. 24 to 28 that are schematic partial cross-sectional views of a semiconductor substrate 10 and the like.

[Step-500]

First, a step similar to [Step-300] in Example 3 is carried out.

[Step-505]

A step similar to [Step-305] in Example 3 is carried out.

[Step-510]

Then, the first ferromagnetic layer is patterned by a lithography technique and an RIE method, to obtain the tunnel magnetoresistance device 30 having the tunnel barrier 34 sandwiched between the first and second ferromagnetic layers 32, 33 and 35, and at the same time, to obtain the extending portion 37 of the first ferromagnetic layer (specifically, the extending portions of the pinned magnetic layer 33, the anti-ferromagnetic layer 32 and the barrier layer 31). In this manner, a structure shown in FIG. 24 can be obtained.

[Step-515]

Figure 25:
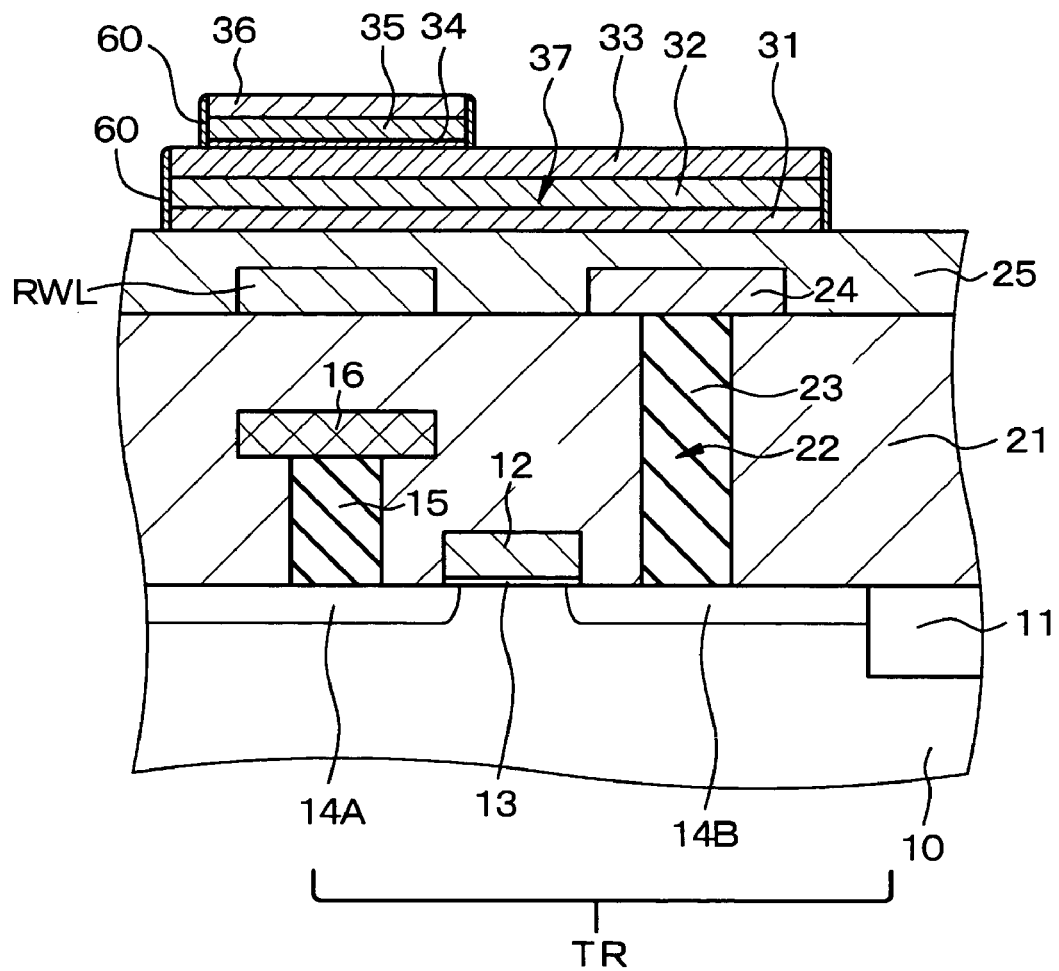
FIG. 25, following
Figure 26:
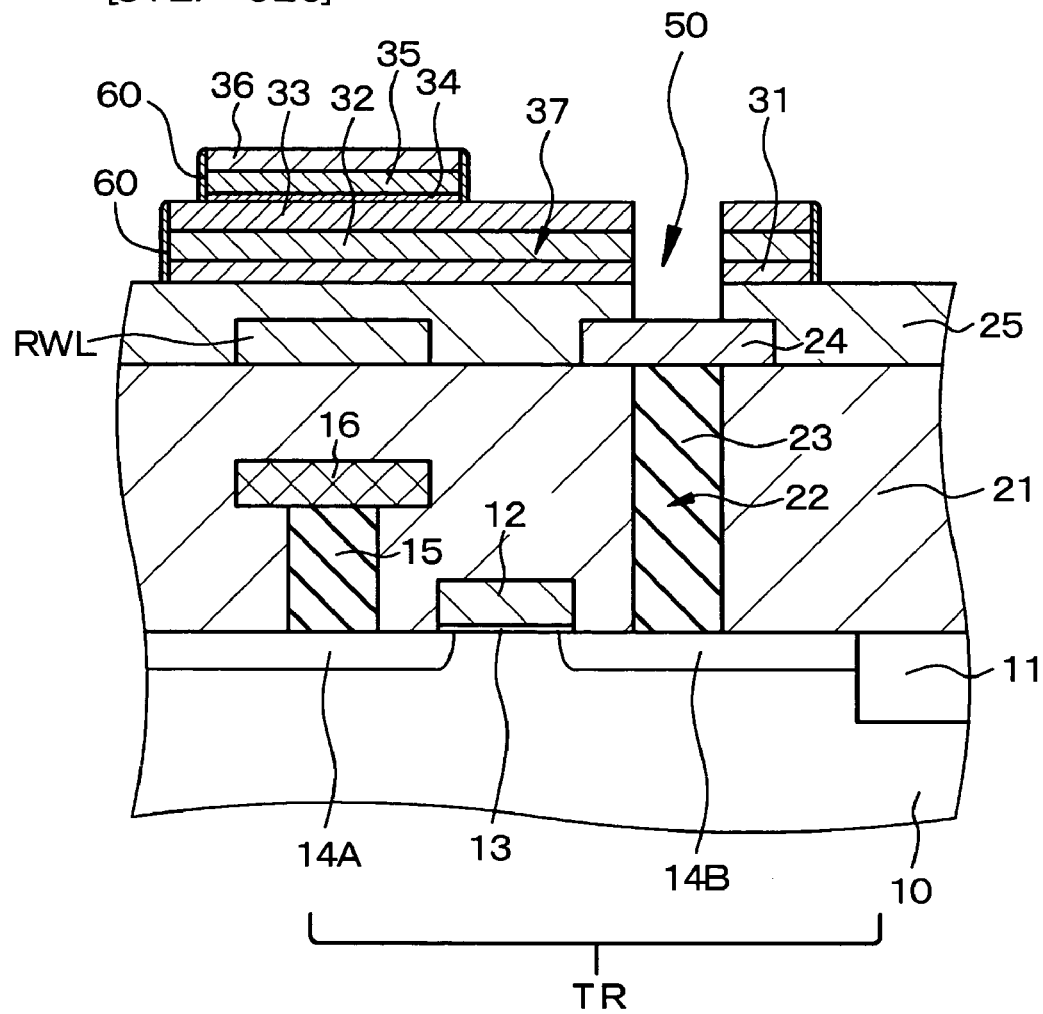
FIG. 26, following
Figure 27:
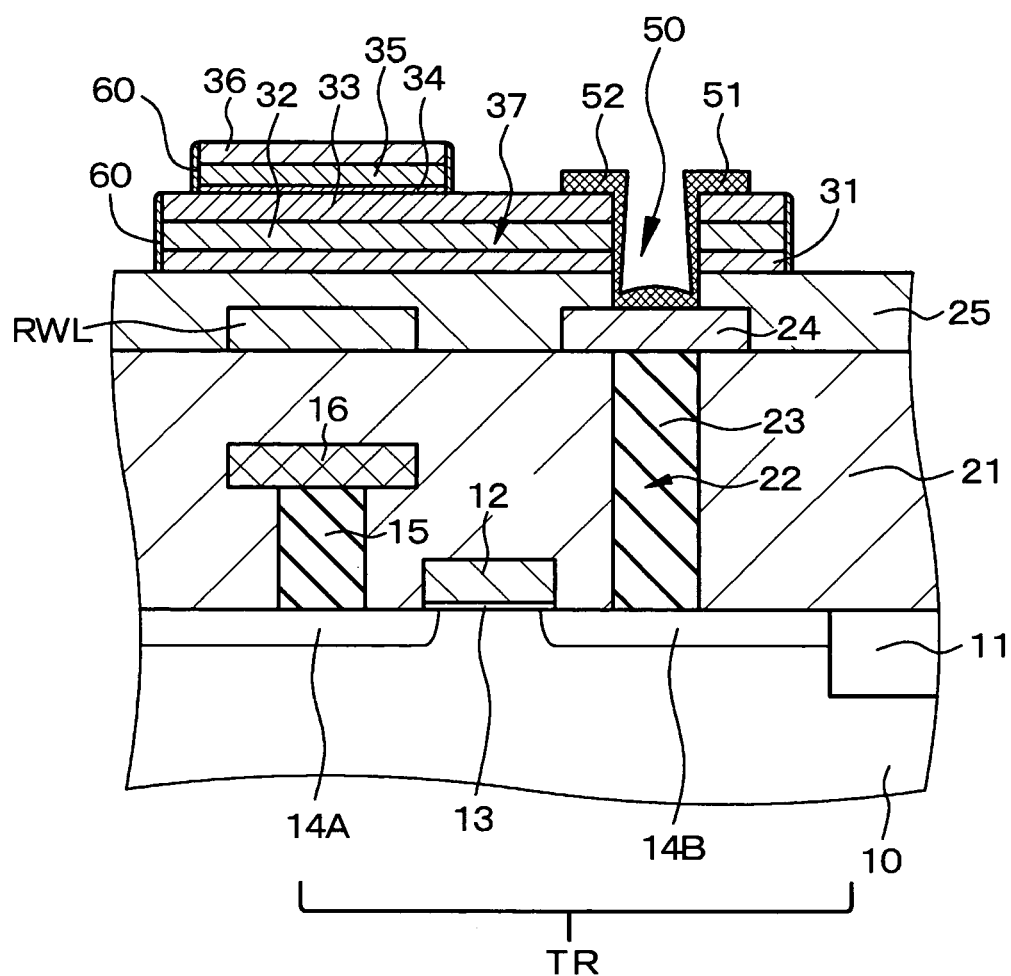
FIG. 27, following

Then, a step similar to [Step-310] in Example 3 is carried out, to form the sidewall 60 on the side surfaces of the top coating layer 36, the second ferromagnetic layer (memory layer) 35, the tunnel barrier 34, the pinned magnetic layer 33, the anti-ferromagnetic layer 32 and the barrier layer 31 (see FIG. 25).

[Step-520]

Then, the second opening portion 50 is formed through those portions of the first ferromagnetic layer (more specifically, the pinned magnetic layer 33 and the anti-ferromagnetic layer 32) and the second insulating interlayer 25 which portions are positioned above the first connecting hole 23 (specifically, above the landing pad 24). Specifically, a resist layer (not shown) having an opening above the landing pad 24 is formed on the entire surface by a lithography technique. Then, the second opening portion 50 is formed through those portions of the first ferromagnetic layer (the pinned magnetic layer 33 and the anti-ferromagnetic layer 32), the barrier layer 31 and the second insulating layer 25 which portions are positioned above the first connecting hole 23, by an RIE method, and then, the resist layer is removed by an ashing technique. In this manner, a structure shown in FIG. 26 can be obtained. Then, the landing pad 24 exposed in the bottom of the second opening portion 50 is argon-sputtered as required.

[Step-525]

A 50 nm thick electrically conductive layer 51 is formed on the entire surface including an inside of the second opening portion 50 (more specifically, on the pinned magnetic layer 33 including the inside of the second opening portion 50) by a sputtering method. The electrically conductive layer 51 may be also formed, for example, by a CVD method.

[Step-530]

Then, the electrically conductive layer 51 is patterned by a lithography technique and an etching technique. In this manner, there can be formed the second connecting hole 52 connected to the first connecting hole 23 (more specifically, being in contact with the landing pad 24) in the second opening portion 50 (see FIG. 27).

[Step-535]

Then, there are carried out the step of forming a third insulating interlayer 26 and the step of forming a second wiring (bit line BL) on the third insulating interlayer 26. The second wiring (bit line BL) is electrically connected to the second ferromagnetic layer (memory layer) 35 and extends in the second direction different from the first direction. Specifically, steps similar to [Step-150] to [Step-160] can be carried out. FIG. 28 shows a structure obtained upon completion of a step similar to [Step-155].

In Example 5 as well, when the second opening portion 50 is formed in [Step-520], the second insulating interlayer 25 is covered with the first ferromagnetic layer, so that the surface of the second insulating interlayer 25 is free from the formation of a convexoconcave shape. Further, when the landing pad 24 exposed in the bottom of the second opening portion 50 is argon-sputtered as required, the surface of the second insulating interlayer 25 is free from the formation of a convexoconcave shape. Further, the second connecting hole 52 is formed in [Step-525] and [Step-530], so that the second connecting hole 52 obtained is highly reliable.

EXAMPLE 6

Example 6 is a variant of the manufacturing method of an MRAM in Example 5.

In Example 6, in a step similar to [Step-505] in Example 5, the pinned magnetic layer 33 is patterned in addition to the top coating film 36, the second ferromagnetic layer (memory layer) 35 and the tunnel barrier 34. And, in a step similar to [Step-520] in Example 5, the second opening portion 50 is formed through those portions of the anti-ferromagnetic layer 32 and the second insulating interlayer 25 which portions are positioned above the first connecting hole 23. Further, in a step similar to [Step-525] in Example 5, the electrically conductive layer 51 is formed on the anti-ferromagnetic layer 32 including the inside of the second opening portion 50. In the manufacturing method of an MRAM in Example 6, there can be obtained the extending portion 37 of the first ferromagnetic layer (more specifically, the extending portion of the anti-ferromagnetic layer 32) which extending portion has an end face being in contact with the second connecting hole 52. The MRAM in Example 6 differs in the MRAM in Example 5 in that the top portion of the second connecting hole 52 is formed on the anti-ferromagnetic layer 32.

The manufacturing method of an MRAM in Example 6 will be explained below with reference to FIGS. 29 to 33 that are schematic partial cross-sectional views of a substrate 10 and the like.

[Step-600]

First, a step similar to [STep-300] in Example 3 is carried out.

[Step-605]

Then, in a step similar to [Step-305] in Example 3, the pinned magnetic layer 33 is patterned in addition to the top coating film 36, the second ferromagnetic layer (memory layer) 35 and the tunnel barrier 34. Importantly, the pinned magnetic layer 33 is over-etched to some extent so that the pinned magnetic layer 33 is not locally present on the exposed surface of the anti-ferromagnetic layer 32. When the pinned magnetic layer 33 is locally present on the exposed surface of the anti-ferromagnetic layer 32, there may be caused fluctuation in the properties of the tunnel magnetoresistance device 30.

[Step-610]

Then, the first ferromagnetic layer (more specifically, the pinned magnetic layer 33) is patterned according to a lithography technique and an RIE method, whereby there is obtained the tunnel magnetoresistance device 30 having the tunnel barrier 34 sandwiched between the first and second ferromagnetic layers 32, 33 and 35. And, at the same time, there is obtained the extending portion 37 of the first ferromagnetic layer (specifically, the extending portions of the anti-ferromagnetic layer 32 and the barrier layer 31). In this manner, a structure shown in FIG. 29 can be obtained.

[Step-615]

Figure 30:
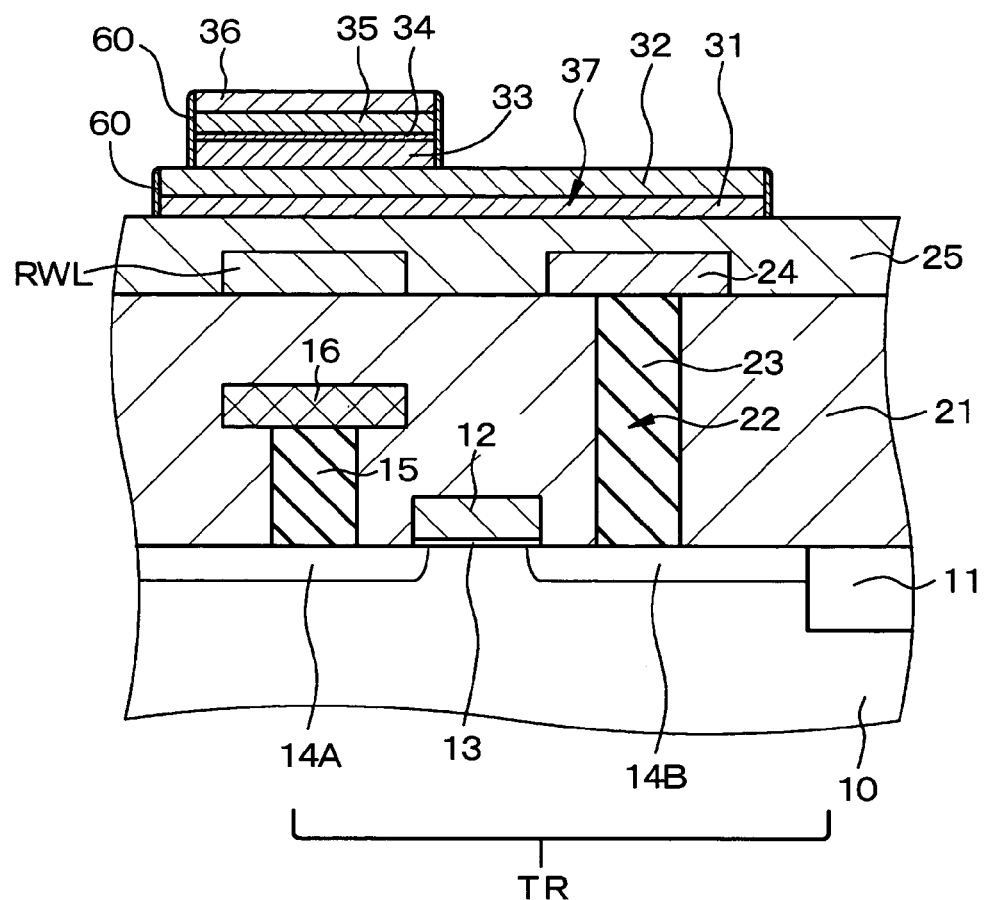
FIG. 30, following
Figure 31:
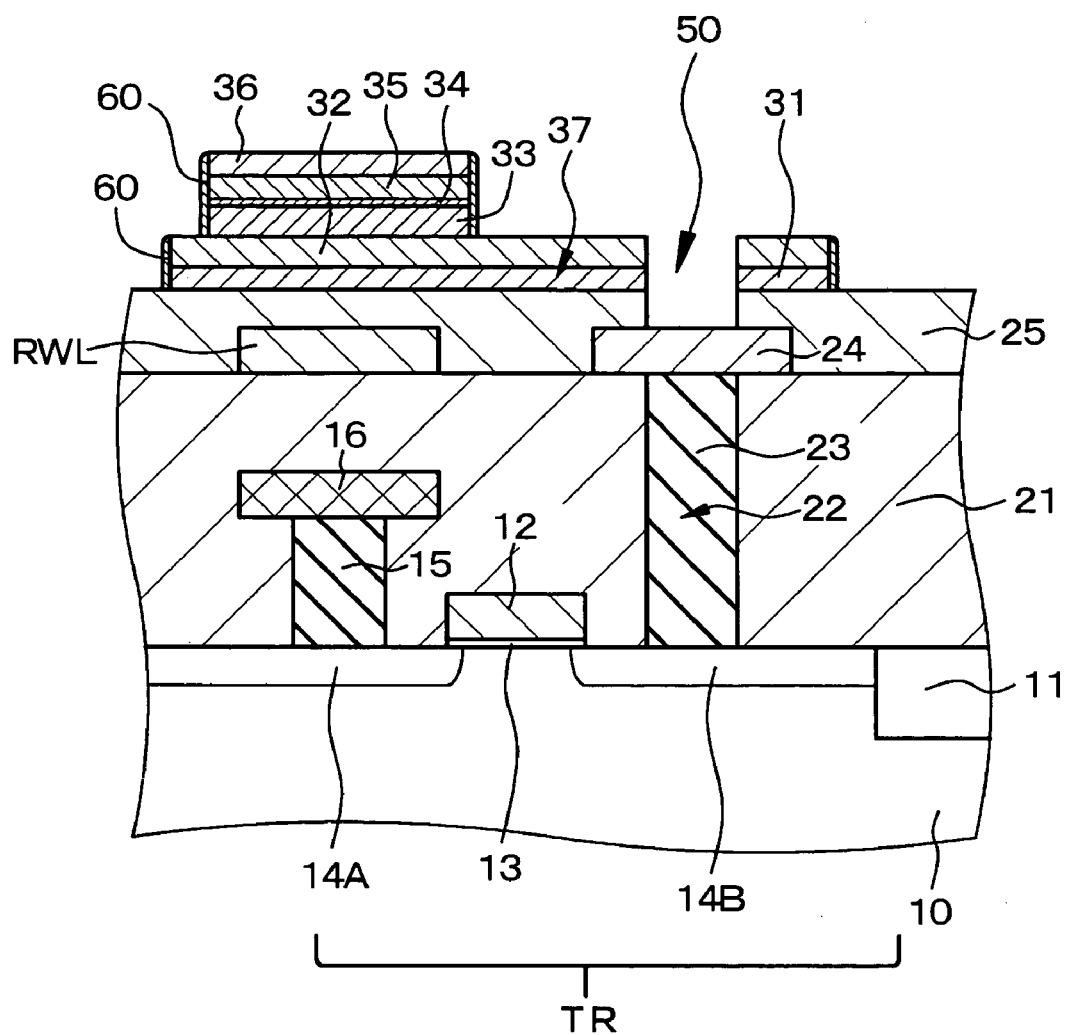
FIG. 31, following
Figure 32:
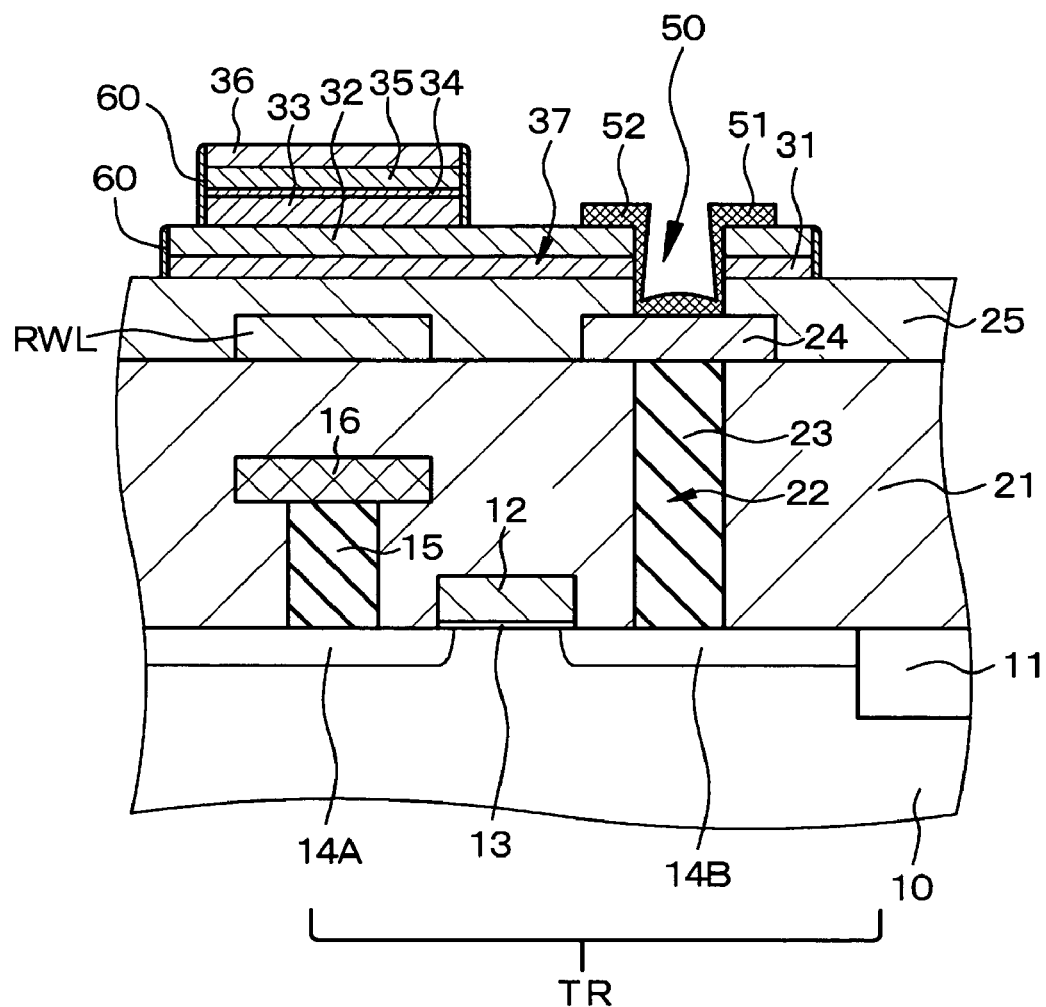
FIG. 32, following

Then, a step similar to [Step-310] in Example 3 is carried out, to form a sidewall 60 on side surfaces of the top coating film 36, the second ferromagnetic layer (memory layer) 35, the tunnel barrier 34, the pinned magnetic layer 33, the anti-ferromagnetic layer 32 and the barrier layer 31 (see FIG. 30).

[Step-620]

Then, the second opening portion 50 is formed through those portions of the first ferromagnetic layer (more specifically, the anti-ferromagnetic layer 32) and the second insulating interlayer 25 which portions are positioned above the first connecting hole 23 (more specifically, above the landing pad 24). Specifically, a resist layer (not shown) having an opening above the landing pad 24 is formed on the entire surface by a lithography technique. Then, the second opening portion 50 is formed through those portions of the first ferromagnetic layer (specifically, the anti-ferromagnetic layer 32), the barrier layer 31 and the second insulating interlayer 25 which portions are positioned above the first connecting hole 23, by an RIE method, and then, the resist layer is removed by an ashing technique. In this manner, a structure shown in FIG. 31 can be obtained. Then, the landing pad 24 exposed in the bottom of the second opening portion 50 is argon-sputtered as required.

[Step-625]

Then, a 50 nm thick electrically conductive layer 51 made of Ta is formed on the entire surface including the inside of the second opening portion 50 (more specifically, on the anti-ferromagnetic layer 32 including the inside of the second opening portion 50) by a sputtering method. The electrically conductive layer 51 may be also formed, for example, by a CVD method.

[Step-630]

Then, the electrically conductive layer 51 is patterned by a lithography technique and an etching technique. In this manner, there can be formed the second connecting hole 52 connected to the first connecting hole 23 (more specifically, being in contact with the landing pad 24) in the second opening portion 50 (see FIG. 32).

[Step-635]

Figure 33:
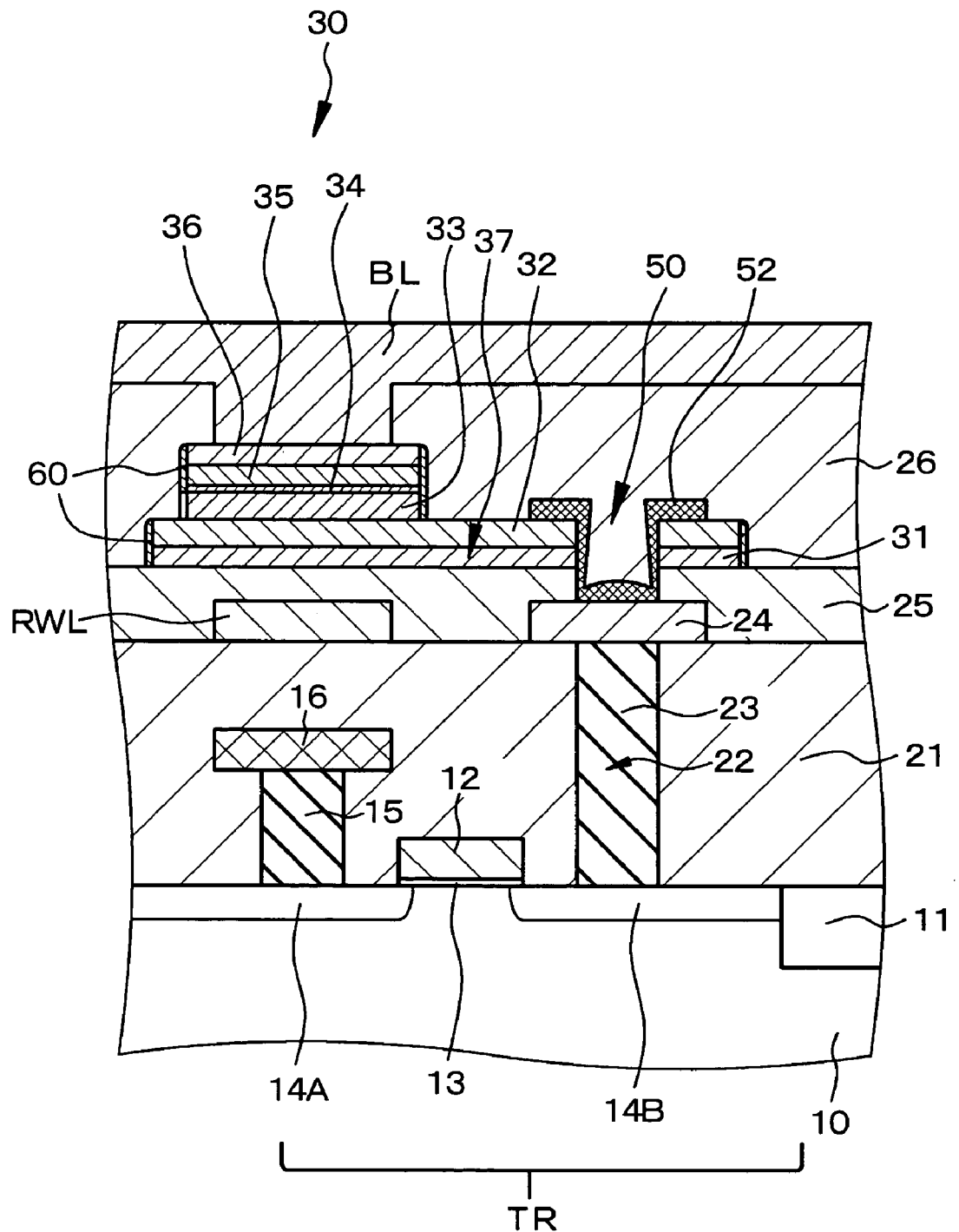
FIG. 33, following
Figure 34A:
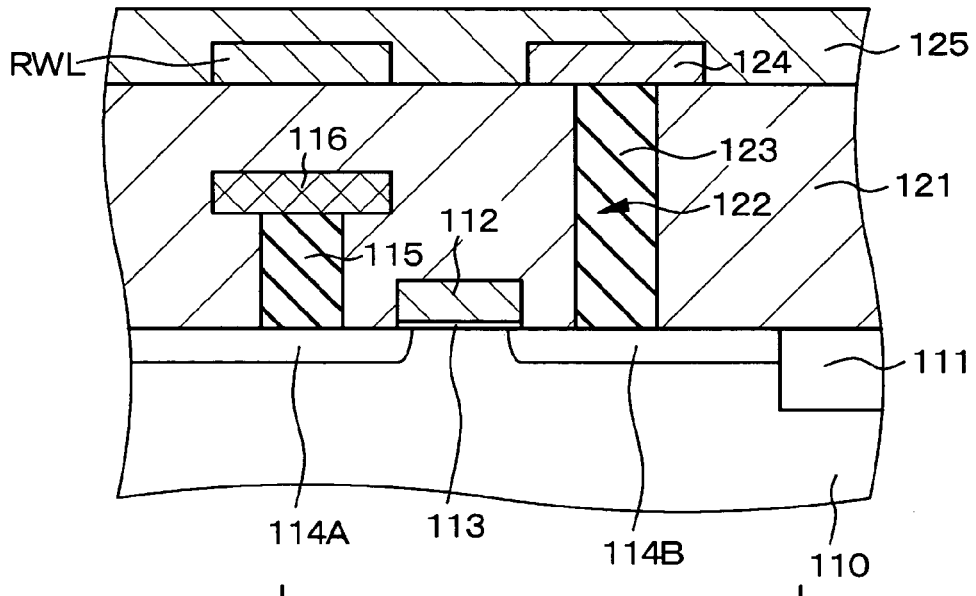
FIGS. 34A and 34B are schematic partial cross-sectional views of a semiconductor substrate, etc., for explaining a manufacturing method of a conventional MRAM type nonvolatile magnetic memory device.
Figure 34B:
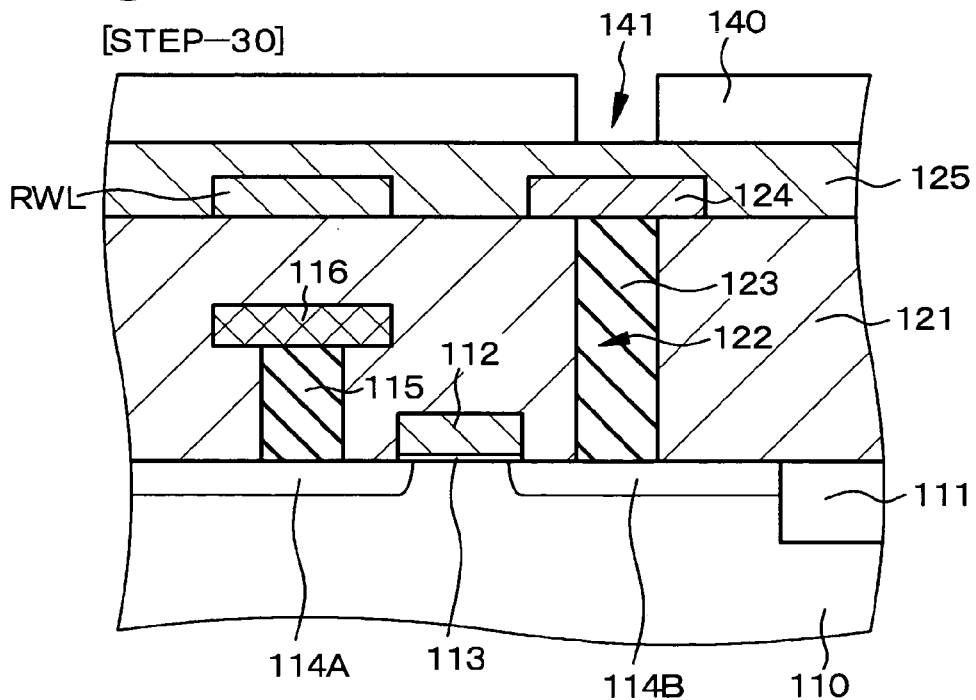
Figure 35:
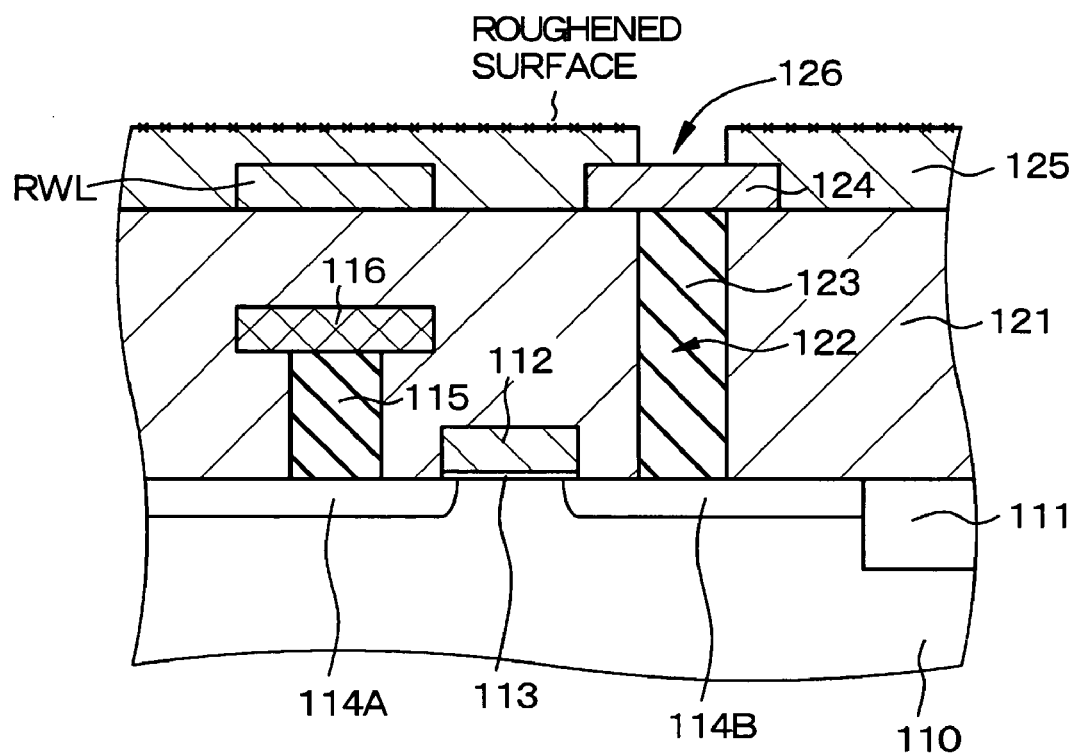
FIG. 35, following
Figure 36:
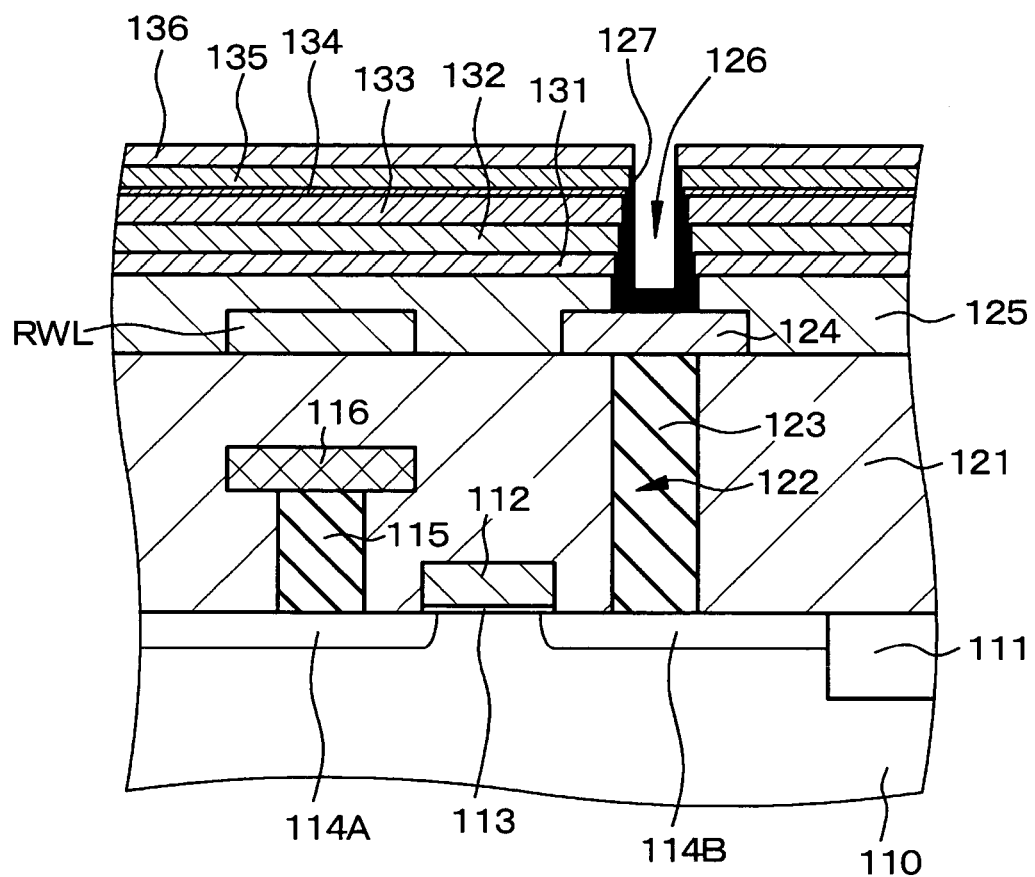
FIG. 36, following
Figure 37:
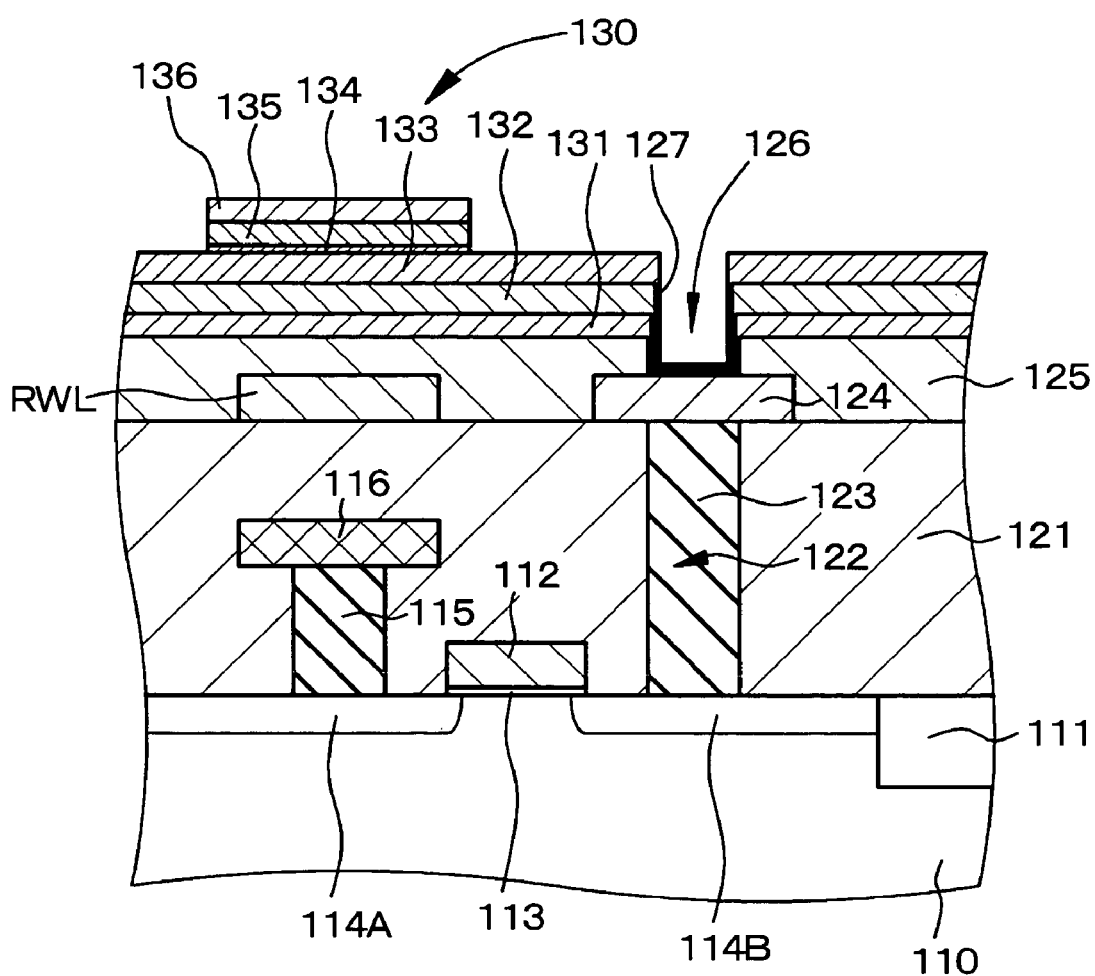
FIG. 37, following
Figure 38:
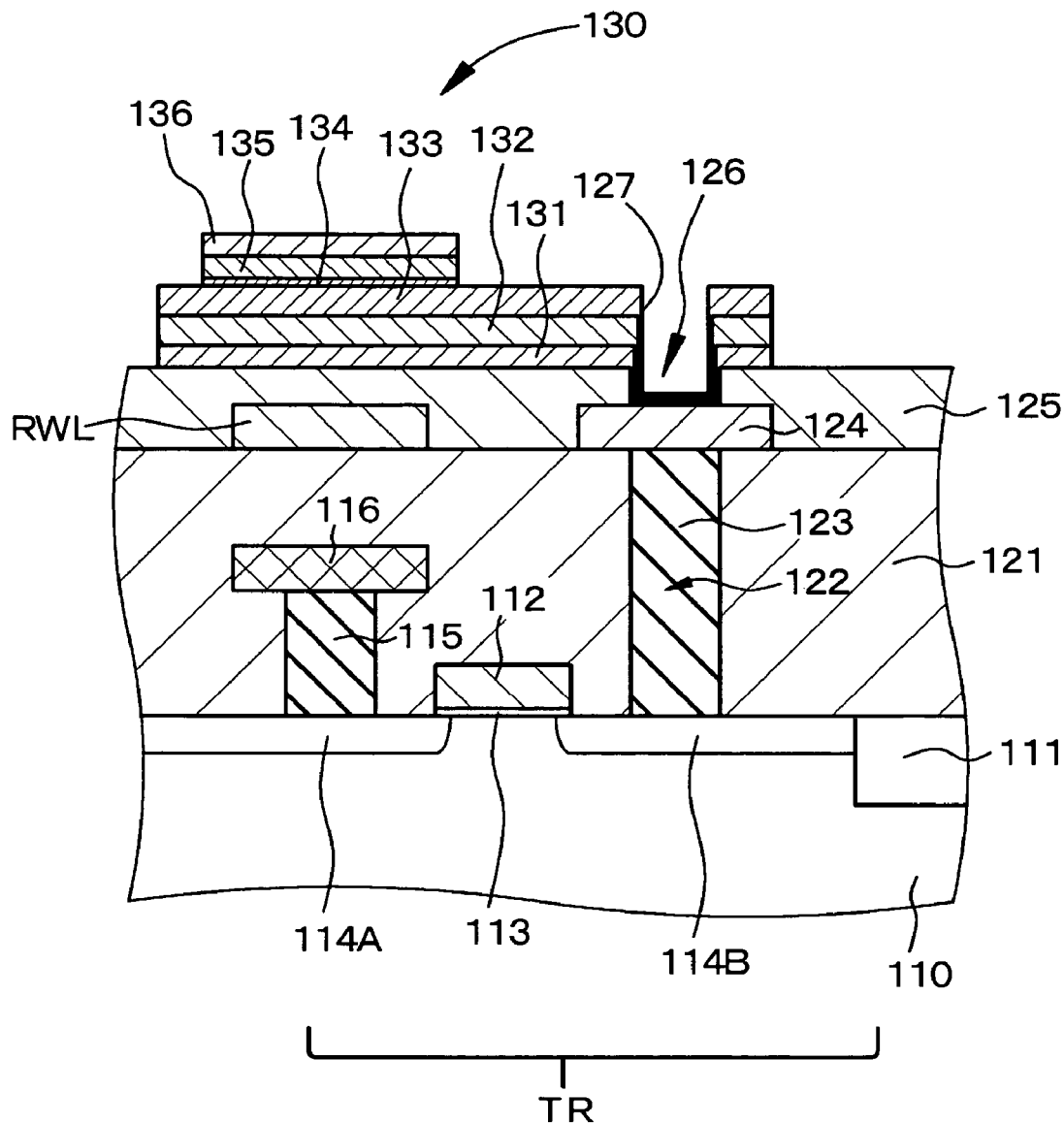
FIG. 38, following
Figure 39:
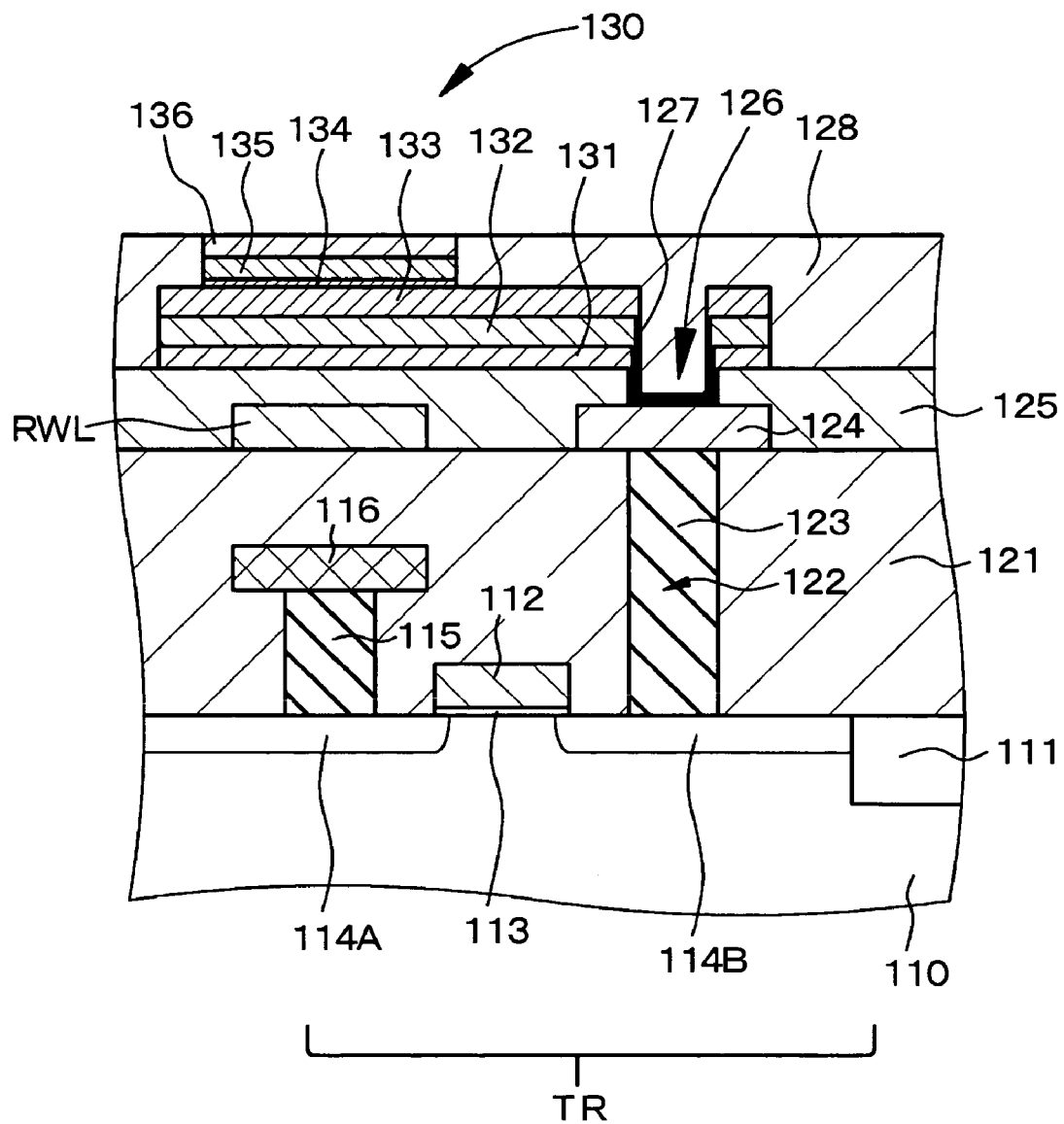
FIG. 39, following
Figure 40:
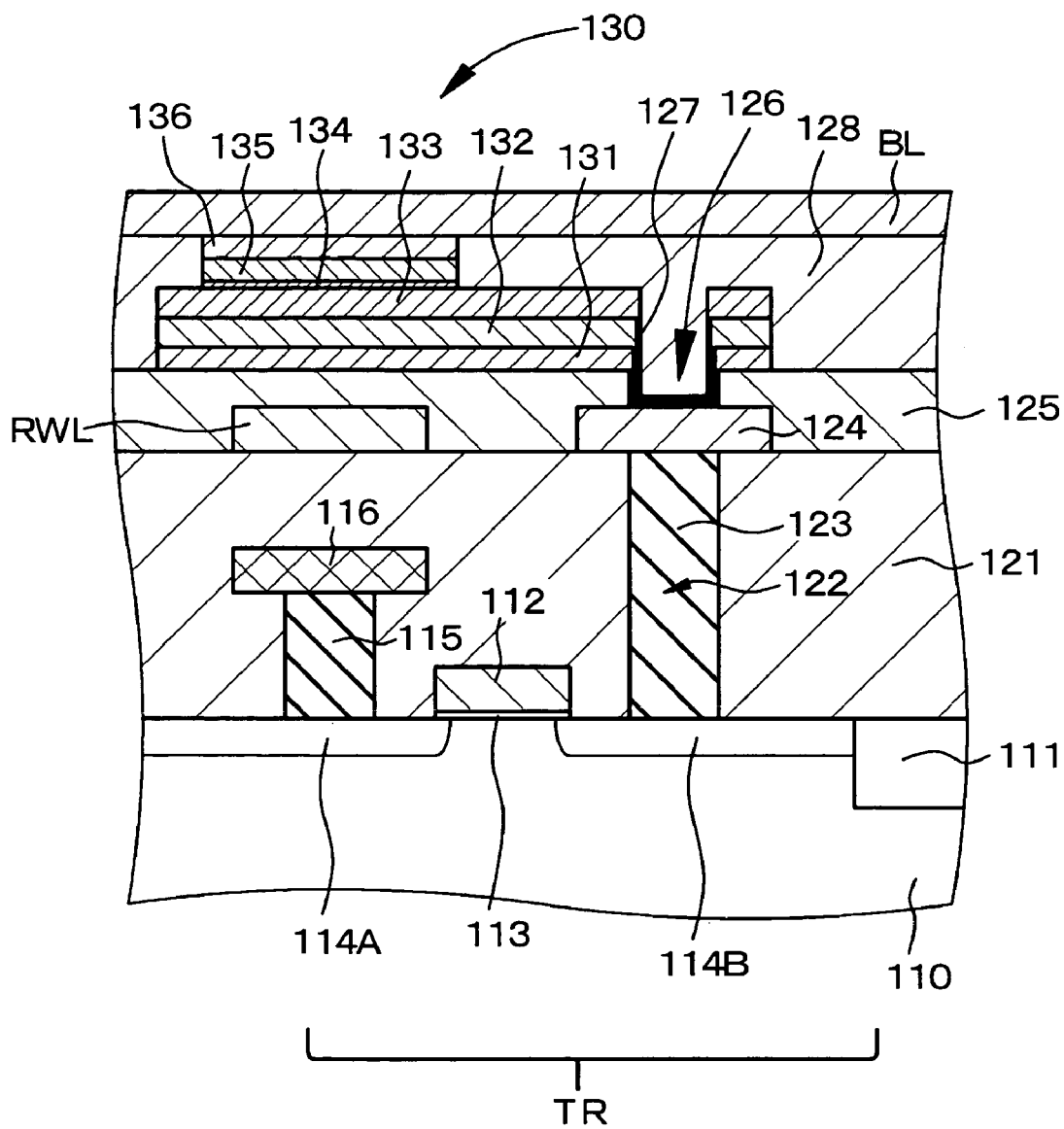
FIG. 40, following

Then, there are carried out the step of forming a third insulating interlayer 26 on the entire surface and the step of forming a second wiring (bit line BL) on the third insulating interlayer 26. The second wiring (bit line BL) is electrically connected to the second ferromagnetic layer (memory layer) 35 and extends in the second direction different from the first direction. Specifically, steps similar to [Step-150] to [Step-160] in Example 1 can be carried out. FIG. 33 shows a structure obtained upon completion of a step similar to [Step-155].

While the present invention has been explained with reference to Examples hereinabove, the present invention shall not be limited thereto. Those materials for constituting layers, the method of forming the layers and the MRAM structures explained in Examples are given as examples and can be modified and changed as required.

When the tunnel magnetoresistance device 30 having the tunnel barrier 34 sandwiched between the first and second ferromagnetic layers 32, 33 and 35 is formed, the plan form of the tunnel magnetoresistance device 30 may be a rectangular form whose facing two sides are in parallel with the first direction or may be a rhombic or rhomboidal form whose facing two sides are in parallel with the first direction. In the latter case, the remaining two sides are no longer in parallel with the second direction, and the inversion speed of the magnetization direction of the second ferromagnetic layer (memory layer) 35 can be increased.

In the present invention, the surface of the second insulating interlayer corresponding to the substratum of the tunnel magnetoresistance device 30 is substantially maintained intact or not treated after the formation of the stacking structure, so that the surface of the second insulating interlayer can be maintained in a remarkably flat state. Further, there is provided a structure in which the end face of the extending portion of the anti-ferromagnetic layer 32 which extending portion corresponds to a lead wire from the tunnel magnetoresistance device 30 is in contact with the side surface of the second connecting hole or in which the end faces of the extending portions of the anti-ferromagnetic layer 32 and the pinned magnetic layer 33 which extending portions correspond to a lead wire from the tunnel magnetoresistance device 30 are in contact with the side surface of the second connecting hole, so that a stable low-resistance second connecting hole can be obtained without causing the problem that step cut or breakage of the step coverage in the second opening portion occurs. As a result of these, there can be suppressed fluctuation in the properties of the tunnel magnetoresistance device, and three can be manufactured a nonvolatile magnetic memory device having high reliability and stable properties.

What is claimed is:

1. A nonvolatile magnetic memory device comprising;
    (a) a transistor for selection, formed in a semiconductor substrate,
    (b) a first insulating interlayer covering the transistor for selection,
    (c) a first connecting hole formed in a first opening portion formed through the first insulating interlayer, and connected to the transistor for selection,
    (d) a first wiring being formed on the first insulating interlayer and extending in a first direction,
    (e) a second insulating interlayer covering the first insulating interlayer and the first wiring,
    (f) a tunnel magnetoresistance device being formed on the second insulating interlayer and comprising a tunnel barrier and two ferromagnetic layers, said tunnel barrier being sandwiched between said two ferromagnetic layers, one of the ferromagnetic layers including an anti-ferromagnetic layer and a pinned magnetic layer,
    (g) a third insulating interlayer covering the tunnel magnetoresistance device and the second insulating interlayer,
    (h) a second wiring being formed on the third insulating interlayer, being electrically connected to one end of the tunnel magnetoresistance device and extending in a second direction different from the first direction, and
    (i) a second connecting hole formed in a second opening portion formed through the second insulating interlayer, and connected to the first connecting hole,
    in which an end face of an extending portion of the anti-ferromagnetic layer but not the pinned magnetic layer is in contact with the second connecting hole.

* * * * *